(12) United States Patent
Ogasawara

(10) Patent No.: US 10,163,604 B2
(45) Date of Patent: Dec. 25, 2018

(54) MULTIPLE CHARGED PARTICLE BEAM APPARATUS

(71) Applicant: NuFlare Technology, Inc., Yokohama-shi (JP)

(72) Inventor: Munehiro Ogasawara, Hiratsuka (JP)

(73) Assignee: NuFlare Technology, Inc., Yokohama-shi (JP)

(*) Notice: Subject to any disclaimer, the term of this patent is extended or adjusted under 35 U.S.C. 154(b) by 0 days.

(21) Appl. No.: 15/375,604

(22) Filed: Dec. 12, 2016

(65) Prior Publication Data

US 2017/0178862 A1    Jun. 22, 2017

(30) Foreign Application Priority Data

Dec. 22, 2015 (JP) ................ 2015-249309

(51) Int. Cl.
*H01J 37/317* (2006.01)
*H01J 37/04* (2006.01)
(Continued)

(52) U.S. Cl.
CPC ........ *H01J 37/3177* (2013.01); *H01J 37/045* (2013.01); *H01J 37/10* (2013.01);
(Continued)

(58) Field of Classification Search
USPC ..................................... 250/492.3
See application file for complete search history.

(56) References Cited

U.S. PATENT DOCUMENTS 4,985,634 A * 1/1991 Stengl ................ B82Y 10/00
                                            250/281
6,723,997 B2 * 4/2004 Matsuya ............ G01N 23/225
                                            250/305
(Continued)

FOREIGN PATENT DOCUMENTS

JP  2004-040076  2/2004
JP  2013-93566   5/2013
JP  2015-167212  9/2015

OTHER PUBLICATIONS

Combined Office Action and Search Report dated Nov. 17, 2017 in Taiwanese Patent Application No. 105139697 (with English language translation).

(Continued)

*Primary Examiner* — Phillip A Johnston
(74) *Attorney, Agent, or Firm* — Oblon, McClelland, Maier & Neustadt, L.L.P.

(57) ABSTRACT

A multiple charged particle beam apparatus includes: a first aperture array substrate to form multiple beams; a first grating lens that constitutes a concave lens by using the first aperture array substrate as a grating; a second aperture array substrate that allows the multiple beams to pass through; and a first limiting aperture substrate arranged in a position of a convergent point of the multiple beams between the first aperture array substrate and the second aperture array substrate, wherein a first aperture array image having passed through the first shaping aperture array substrate is formed on the second aperture array substrate by a lens action including a magnetic field distribution generated between the first aperture array substrate and the second aperture array substrate and having opposite signs and same magnitude and an electric field distribution generated by the first grating lens.

9 Claims, 14 Drawing Sheets

(51) Int. Cl.
*H01J 37/10* (2006.01)
*H01J 37/141* (2006.01)
*H01J 37/22* (2006.01)

(52) U.S. Cl.
CPC .......... *H01J 37/141* (2013.01); *H01J 37/226* (2013.01); *H01J 2237/0435* (2013.01); *H01J 2237/31774* (2013.01)

(56) References Cited

U.S. PATENT DOCUMENTS

| | | | | |
|---|---|---|---|---|
| 6,768,125 | B2* | 7/2004 | Platzgummer | B82Y 10/00 250/492.1 |
| 7,253,417 | B2* | 8/2007 | Frosien | B82Y 10/00 250/306 |
| 7,283,885 | B2* | 10/2007 | Nakasugi | B82Y 10/00 700/100 |
| 7,872,240 | B2* | 1/2011 | Ito | H01J 37/153 250/305 |
| 8,502,174 | B2* | 8/2013 | Wieland | B82Y 10/00 250/310 |
| 2013/0082187 | A1 | 4/2013 | Ogasawara | |
| 2015/0255249 | A1 | 9/2015 | Ogasawara | |

OTHER PUBLICATIONS

Office Action dated Feb. 19, 2018, in Korean Patent Application No. 10-2016-0174629, w/English-language Translation.

* cited by examiner

MULTIPLE CHARGED PARTICLE BEAM APPARATUS

CROSS-REFERENCE TO RELATED APPLICATION

This application is based upon and claims the benefit of priority from prior Japanese Patent Application No. 2015-249309 filed on Dec. 22, 2015 in Japan, the entire contents of which are incorporated herein by reference.

BACKGROUND OF THE INVENTION

Field of the Invention

Embodiments described herein relate generally to a multiple charged particle beam apparatus and, for example, relate to a method of correcting spherical aberration when a target object on a stage is irradiated with multiple beams.

Related Art

A lithography technique which leads development of micropatterning of a semiconductor device is a very important process for exclusively generating a pattern in semiconductor manufacturing processes. In recent years, with an increase in integration density of an LSI, a circuit line width required for semiconductor devices is getting smaller year by year. An electron beam pattern writing technique has inherently superior resolution and a pattern is written to wafers and the like using an electron beam.

For example, a pattern writing apparatus using multiple beams is known. Compared with a case in which one electron beam is used, many beams can be emitted at a time by using multiple beams so that throughput can be improved significantly. In such a pattern writing apparatus of multiple beam mode, for example, an electron beam emitted from an electron gun assembly is passed through a mask having a plurality of holes to form multiple beams, each beam is subjected to blanking control, and each beam that is not shielded is shot at a desired position on a target object. In such a pattern writing apparatus of multiple beam mode, electrons scattered when an electron beam is passed through a mask (multiple beam forming aperture plate) having a plurality of holes for forming multiple beams flow into a blanking deflection electrode array that exercises blanking control, posing a problem that an insulator portion of the blanking deflection electrode array is charged. Thus, a method of eliminating scattered electrons entering the blanking deflection electrode array by arranging a doublet lens between the multiple beam forming aperture plate and the blanking deflection electrode array to form a crossover between electromagnetic lenses constituting the doublet lens and arranging an aperture plate (contrast aperture plate) near the crossover is proposed (see Published Unexamined Japanese Patent Application No. 2013-093566 (JP-A-2013-093566), for example).

In multiple beam pattern writing, however, the beam size of whole multiple beams grows and thus, aberration on the optical axis of a crossover image forming system grows. Particularly, if the number of beams is increased, the beam size grows for increased beams and further, aberration grows. Distortion can be decreased by using a doublet lens, but when the beam size of multiple beams is large, a new problem of increased spherical aberration of a crossover image by such a doublet lens arises. Thus, the multiple beam diameter in the crossover position grows. Therefore, it is desirable to suppress distortion of multiple beams and also to decrease spherical aberration itself.

BRIEF SUMMARY OF THE INVENTION

According to one aspect of the present invention, a multiple charged particle beam apparatus includes: an emission source configured to emit a charged particle beam; an illumination lens configured to illuminate the charged particle beam; a first aperture array substrate that has a plurality of first openings formed therein and receives irradiation of the charged particle beam illuminated in a region including the plurality of first openings as a whole to form multiple beams by making portions of the charged particle beam individually pass through a corresponding one of the plurality of first openings; a first grating lens that constitutes a concave lens by using the first aperture array substrate as a grating; a second aperture array substrate that has a plurality of second openings formed therein and allows at least a portion of a corresponding beam of the multiple beams to pass through each of the plurality of second openings; a first limiting aperture substrate arranged in a position of a convergent point of the multiple beams between the first aperture array substrate and the second aperture array substrate to limit passing of charged particles deviating from the convergent point; and a stage capable of continuously moving on which a target object receiving the irradiation of a beam group being at least a portion of the multiple beams having passed through the second aperture array substrate is placed, wherein a first aperture array image having passed through the first shaping aperture array substrate is formed on the second aperture array substrate by a lens action including a magnetic field distribution in which magnetic fields generated between the first aperture array substrate and the second aperture array substrate and having opposite signs and same magnitude continue and an electric field distribution generated by the first grating lens.

According to another aspect of the present invention, a multiple charged particle beam apparatus includes: an emission source configured to emit a charged particle beam; an illumination lens configured to illuminate the charged particle beam; a first shaping aperture array substrate that has a plurality of first openings formed therein and receives irradiation of the charged particle beam illuminated in a region including the plurality of first openings as a whole to form multiple beams by making portions of the charged particle beam individually pass through a corresponding one of the plurality of first openings; a first grating lens that constitutes a concave lens by using the first shaping aperture array substrate as a grating; a doublet lens arranged on an opposite side of a side of the emission source with respect to the first grating lens and having first and second electromagnetic lenses excited to have magnetic fields with opposite signs and same magnitude; a first limiting aperture member arranged in a position of a first convergent point of the multiple beams between the first and second electromagnetic lenses to limit passing of charged particles deviating from the convergent point; and a stage capable of continuously moving on which a target object receiving the irradiation of a beam group being at least a portion of the multiple beams having passed through the doublet lens is placed.

DETAILED DESCRIPTION OF THE INVENTION

In the following embodiments, a multiple charged particle beam apparatus capable of suppressing distortion of multiple beams and also correcting spherical aberration will be described.

Also in the following embodiments, a configuration using an electron beam as an example of a charged particle beam will be described. However, the charged particle beam is not limited to an electron beam, and a beam such as an ion beam using charged particles may also be used.

Embodiment 1

Figure 1:
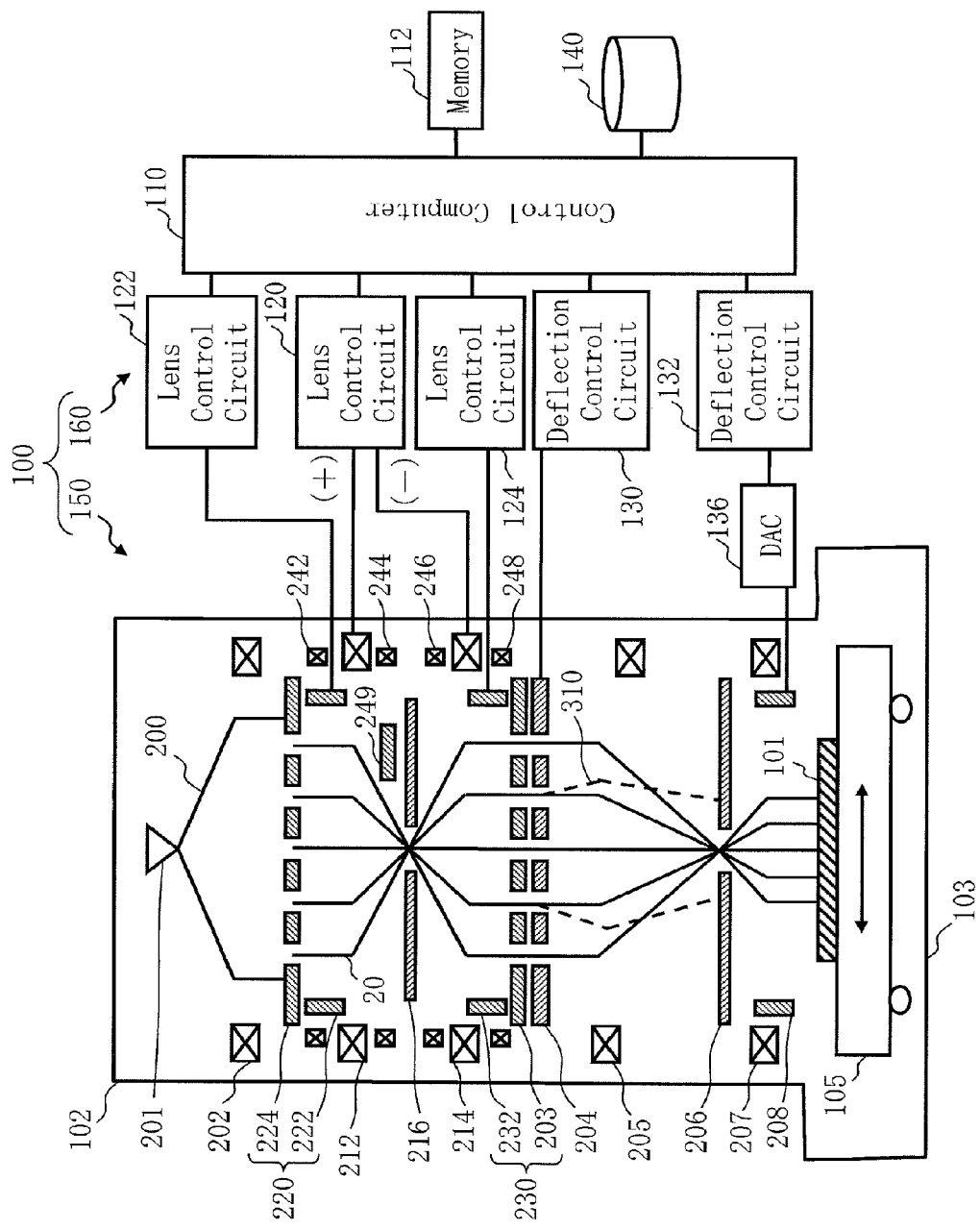
FIG. 1 is a conceptual diagram showing a configuration of a pattern writing apparatus according to Embodiment 1.

FIG. 1 is a conceptual diagram showing a configuration of a pattern writing apparatus according to Embodiment 1; In FIG. 1, a pattern writing apparatus 100 includes a pattern writing mechanism 150 and a control system circuit 160. The pattern writing apparatus 100 is an example of the multiple charged particle beam apparatus and also an example of the multiple charged particle beam pattern writing apparatus. The pattern writing mechanism 150 includes an electron optical column 102 and a pattern writing chamber 103. Inside the electron optical column 102, an electron gun assembly 201, an illumination lens 202, a pre-shaping aperture array substrate 224, an electrostatic lens 222, electromagnetic lenses 212, 214 constituting a doublet lens, a limiting aperture substrate 216, an electrostatic lens 232, a shaping aperture array substrate 203, a blanking aperture array mechanism 204, a reducing lens 205, a limiting aperture substrate 206 (blanking aperture plate), an objective lens 207, a deflector 208, a detector 249, and alignment coils 242, 244, 246, 248 are arranged. An XY stage 105 is arranged inside the pattern writing chamber 103. The target object 101 such as a mask to be a substrate on which a pattern may be written when a pattern is written is arranged on the XY stage 105. The target object 101 is held on the XY stage 105 by, for example, three-point support (not shown). The target object 101 includes an exposure mask for manufacturing semiconductor devices or a semiconductor substrate (silicon wafer) on which semiconductor devices are manufactured. The target object 101 also includes mask blanks to which a resist is applied and on which no pattern is written.

The pre-shaping aperture array substrate 224 desirably includes a rotating stage whose rotation axis is parallel to the center axis of the optical column so that the orientation of the aperture array can be changed by control from outside the optical column.

The electrostatic lens 222 is arranged immediately close on the side of the blanking aperture array mechanism 204 on the opposite side of the electron gun assembly 201 with respect to the pre-shaping aperture array substrate 224 (first shaping aperture array substrate or first aperture array substrate). For example, the electrostatic lens 222 is arranged between the pre-shaping aperture array substrate 224 and the electromagnetic lens 212 constituting the doublet lens upstream of the optical axis. Then, the electrostatic lens 222 becomes a grating lens 220 (first grating lens) using the pre-shaping aperture array substrate 224 as a grating. The grating lens 220 constitutes, as will be described below, a concave lens.

The doublet lens constituted of the electromagnetic lens 212 (first electromagnetic lens) and the electromagnetic lens 214 (second electromagnetic lens) is arranged on the opposite side of the electron gun assembly 201 with respect to the grating lens 220 and between the grating lens 220 and the blanking aperture array mechanism 204. The electromagnetic lens 212 and the electromagnetic lens 214 are excited in the same magnitude with opposite signs of the axial magnetic field.

The electromagnetic lenses 212, 214 only need to generate magnetic fields having a lens effect that satisfy conditions and structures such as ferromagnetic materials and coils constituting the electromagnetic lenses do no need to be arranged between the first shaping aperture array substrate and a second shaping aperture array described below.

The limiting aperture substrate 216 is arranged in a convergent point position of multiple beams between the electromagnetic lens 212 and the electromagnetic lens 214. In addition, the limiting aperture substrate 216 is ground-connected.

The shaping aperture array substrate 203 (second shaping aperture array substrate or second aperture array substrate) is arranged on the side of the XY stage 105 with respect to the doublet lens.

The electrostatic lens 232 is arranged immediately close on the doublet lens side constituted of the electromagnetic lenses 212, 214 with respect to the shaping aperture array substrate 203. Then, the electrostatic lens 232 becomes a grating lens 230 (second grating lens) using the shaping aperture array substrate 203 as a grating. The grating lens 230 constitutes, as will be described below, a concave lens.

The alignment coils 242, 244, 246, 248 are arranged between the pre-shaping aperture array substrate 224 and the shaping aperture array substrate 203. Particularly, the alignment coils 244, 246 are arranged between the electromagnetic lenses 212, 214.

The control system circuit 160 includes a control computer 110, a memory 112, lens control circuits 120, 122, 124, a deflection control circuit 130, a deflection control circuit 132, a digital/analog conversion (DAC) amplifier 136, and a storage device 140 such as a magnetic disk drive. The control computer 110, the memory 112, the lens control circuits 120, 122, 124, the deflection control circuit 130, the deflection control circuit 132, and the storage device 140 are mutually connected via a bus (not shown). A DAC amplifier 136 is connected to the deflection control circuit 132. Pattern writing data is input from outside the pattern writing apparatus 100 and stored in the storage device 140 (storage unit). The lens control circuits 120, 122, 124 and the deflection control circuits 130, 132 are controlled by the control computer 110.

The electromagnetic lenses 212, 214 are connected to the lens control circuit 120 and controlled. The electrostatic lens 222 is connected to the lens control circuit 122 and controlled. The electrostatic lens 232 is connected to the lens control circuit 124 and controlled. The blanking aperture array mechanism 204 is connected to the deflection control circuit 130 and controlled. The deflector 208 is connected to the deflection control circuit 132 via the DAC amplifier 136 and controlled. It is needless to say that respective lens control circuits (not shown) are connected to the alignment coils 242, 244, 246, 248.

A lens system including the electromagnetic lenses 212, 214 and/or the electrostatic lenses 222, 232 has a function to form an image of an opening on the pre-shaping aperture array substrate 224 onto the corresponding opening of the shaping aperture array substrate 203 in equal magnification.

Here, in FIG. 1, only the configuration needed to describe Embodiment 1 is shown. Other configurations normally needed for the pattern writing apparatus 100 may also be included.

Figure 2A:
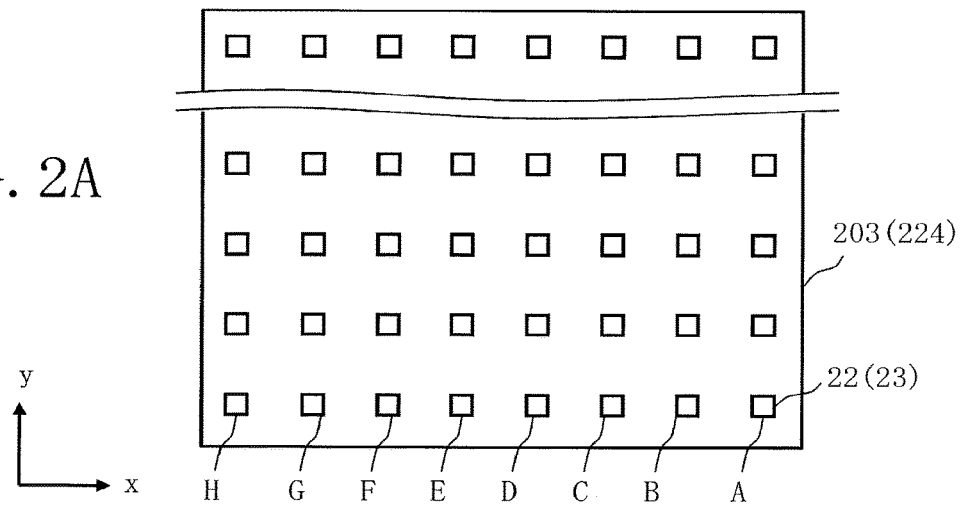
FIGS. 2A and 2B are conceptual diagrams showing the configuration of a shaping aperture array substrate according to Embodiment 1.
Figure 2B:
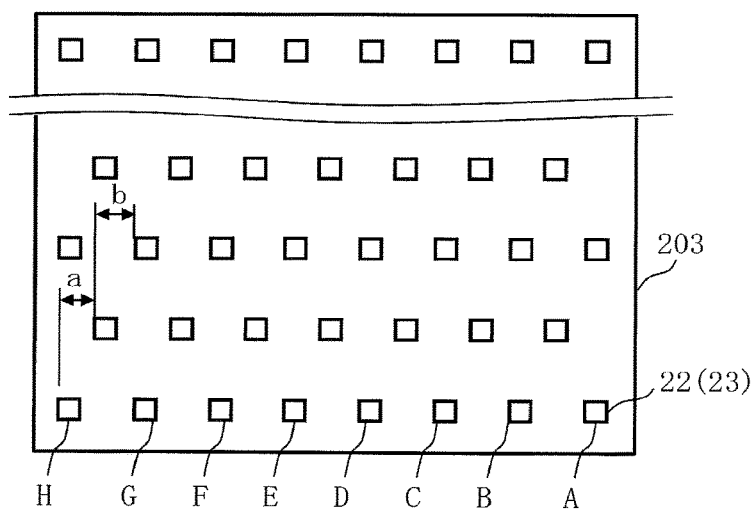

FIGS. 2A and 2B are conceptual diagrams showing the configuration of a shaping aperture array substrate according to Embodiment 1; In FIG. 2A, the shaping aperture array substrate 203 has holes 22 (first openings) of m rows long (y direction)×n columns wide (x direction) (m, n≥2) formed with predetermined arrangement pitches in a matrix of rows and columns. In FIG. 2A, for example, the 512×8 holes 22 are formed. Each of the holes 22 is formed in a rectangular shape of the same dimensions. Alternatively, each of the holes 22 may be formed in a circular shape of the same outside diameter. Here, an example in which the eight holes 22 from A to H are formed in the x direction for each row in the y direction is shown. Multiple beams 20 are formed by a portion of an electron beam 200 being passed through a plurality of these holes 22. Here, an example in which the holes 22 of two or more rows and columns are arranged in both the x and y directions is shown, but the present embodiment is not limited to such an example. In addition, for example, it is also acceptable that a plurality of holes 22 are arranged in only one row (x direction) or in only one column (y direction). That is, in the case of only one row, a plurality of holes 22 are arranged as a plurality of columns, and in the case of only one column, a plurality of holes 22 are arranged as a plurality of rows. Also, the method of arranging the holes 22 is not limited to a case of arranging holes in a grid-like shape like in FIG. 2A. For example, as shown in FIG. 2B, the holes in the first row and the second row in the length direction (y direction) may be arranged by being shifted by a dimension a in the width direction (x direction) from each other. Similarly, the holes in the second row and the third row in the length direction (y direction) may be arranged by being shifted by a dimension b in the width direction (x direction) from each other.

The pre-shaping aperture array substrate 224 is also formed in the same manner as the shaping aperture array substrate 203. A plurality of holes 23 (second openings) formed in the pre-shaping aperture array substrate 224 is formed so as to be in the same physical relationship as the plurality of corresponding holes 22 formed in the shaping aperture array substrate 203. However, the plurality of holes 23 formed in the pre-shaping aperture array substrate 224 is formed in a size a little larger than that of the plurality of holes 22 formed in the shaping aperture array substrate 203. Accordingly, the shape of the multiple beams 20 is determined by the shaping aperture array substrate 203. However, the present embodiment is not limited to such an example. The plurality of holes 22 formed in the shaping aperture array substrate 203 may be formed in a size a little larger than that of the plurality of holes 23 formed in the pre-shaping aperture array substrate 224 so that the shape of the multiple beams 20 is determined by the plurality of holes 23 formed in the pre-shaping aperture array substrate 224.

Figure 3:
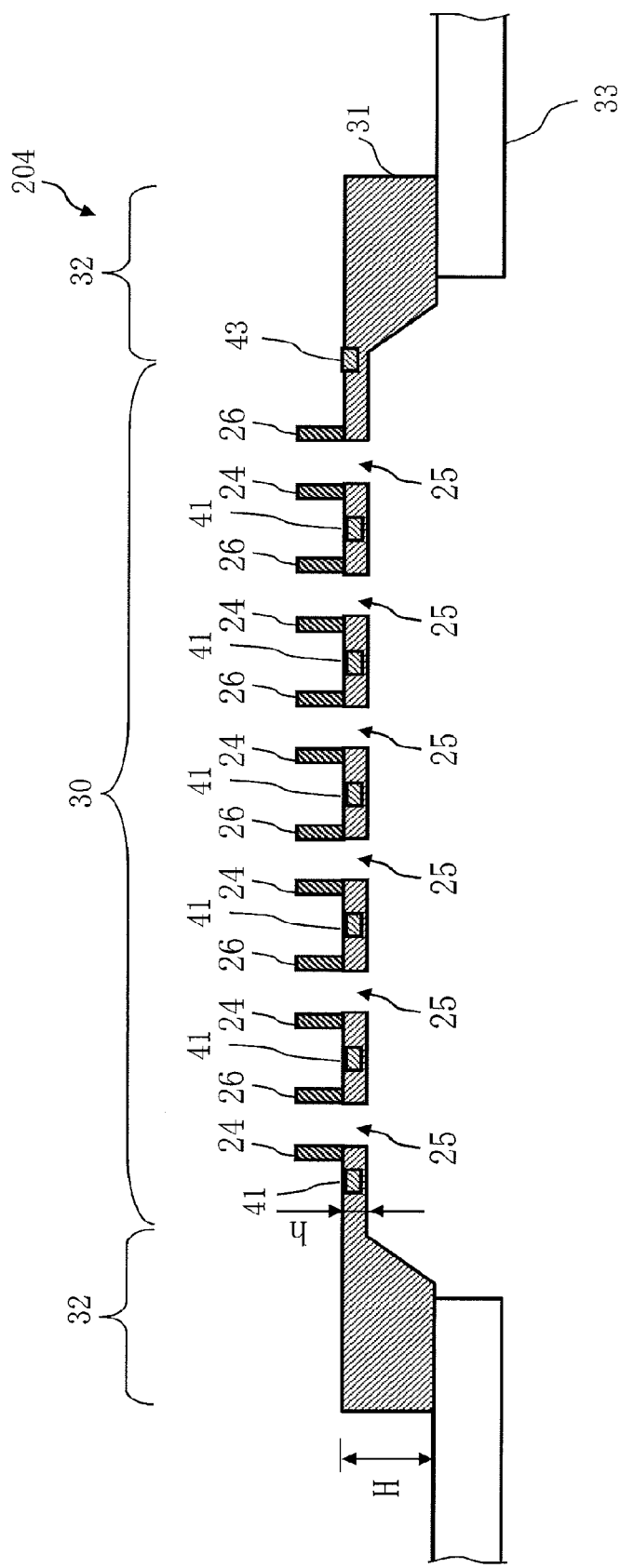
FIG. 3 is a sectional view showing the configuration of a blanking aperture array mechanism according to Embodiment 1.

FIG. 3 is a sectional view showing the configuration of a blanking aperture array mechanism according to Embodiment 1.

Figure 4:
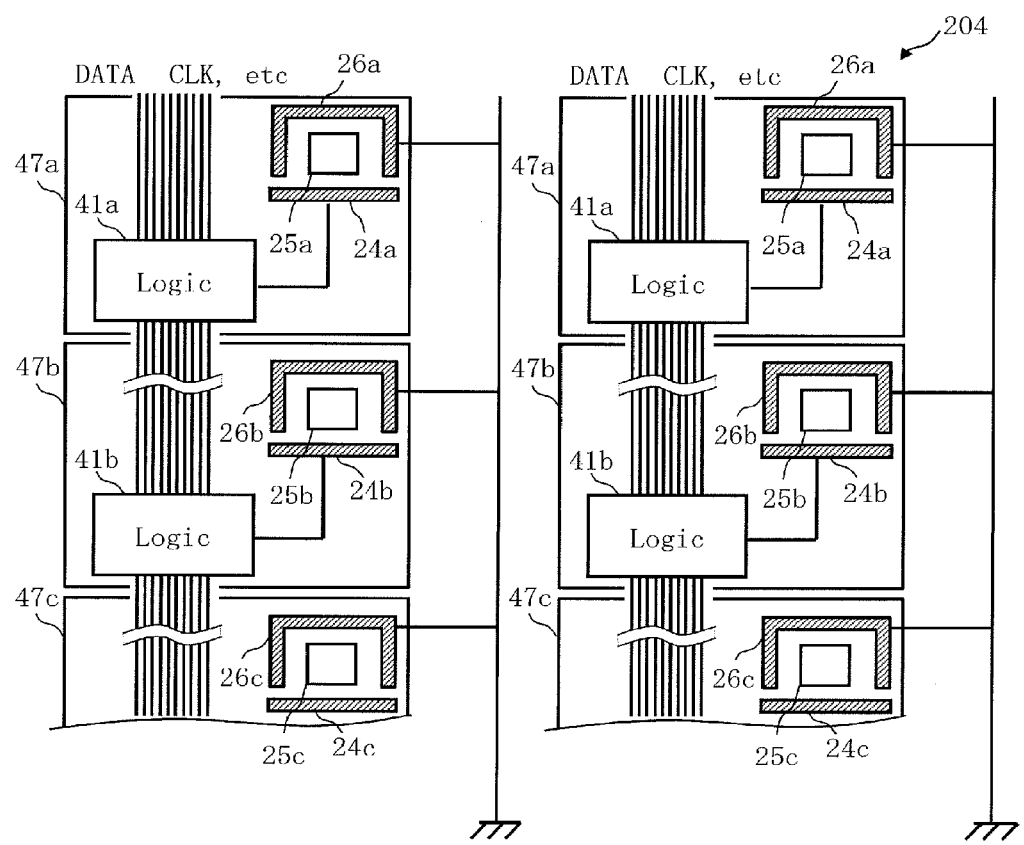
FIG. 4 is a top conceptual diagram showing a portion of the configuration inside a membrane region of the blanking aperture array mechanism according to Embodiment 1.

FIG. 4 is a top conceptual diagram showing a portion of the configuration inside a membrane region of the blanking aperture array mechanism according to Embodiment 1. In FIGS. 3 and 4, the physical relationship among a control electrode 24, a counter electrode 26, a control circuit 41, and a pad 43 does not correspond to the actual physical relationship. The blanking aperture array mechanism 204 has, as shown in FIG. 3, a semiconductor substrate 31 made of silicon and the like arranged on a fulcrum 33. The center portion of the substrate 31 is, for example, thinly cut from the backside and processed into a membrane region 30 (first region) of a thin thickness h. The periphery surrounding the membrane region 30 is an outer circumferential region 32 (second region) of a thick thickness H. The top surface of the membrane region 30 and the top surface of the outer circumferential region 32 are formed so as to have the same height or substantially the same height. The substrate 31 is held on the fulcrum 33 by the back side of the outer circumferential region 32. The center portion of the fulcrum 33 is open and the membrane region 30 is positioned in a region where the fulcrum 33 is open.

The membrane region 30 has a passing hole 25 (opening) for passing of each beam of multiple beams opened in a position corresponding to each of the holes 22 of the shaping aperture array substrate 203 shown in FIG. 2A (or 2B). Then, as shown in FIGS. 3 and 4, a pair (blanker: blanking deflector) of the control electrode 24 and the counter electrode 26 for blanking deflection is arranged in the membrane region 30 across the passing hole 25 corresponding to a neighborhood position of each of the passing holes 25. Also, the control circuit 41 (logic circuit) that applies a deflecting voltage to the control electrode 24 for each of the passing holes 25 is arranged in the neighborhood of each of the passing holes 25 in the membrane region 30. The counter electrode 26 for each beam is ground-connected.

Also, as shown in FIG. 4, for example, a 10-bit parallel wire for control signal is connected to each of the control circuits 41. In addition to, for example, the 10-bit parallel wire for control signal, a clock signal line and a power wire are connected to each of the control circuits 41. A portion of the parallel wire may be used for the clock signal line or the power wire. An individual blanking mechanism 47 by the control electrode 24, the counter electrode 26, and the control circuit 41 is configured for each beam constituting multiple beams. In the example of FIG. 3, the control electrode 24, the counter electrode 26, and the control circuit 41 are arranged in the membrane region 30 where the thickness of the substrate 31 is thin. However, the present embodiment is not limited to such an example. A plurality of the control circuits 41 formed in the membrane region 30 in an array shape is grouped by, for example, the same row or the same column and the control circuits 41 in a group are connected, as shown in FIG. 4, in series. Then, a signal from the pad 43 arranged for each group is transmitted to the control circuits 41 in the group.

The electron beam 20 passing through each of the passing holes 25 is deflected by voltages of the two electrodes 24, 26 forming a pair applied independently. Blanking control is exercised by such deflection. In other words, a pair of the control electrode 24 and the counter electrode 26 deflects by blanking a corresponding beam of multiple beams having passed through the plurality of the holes 22 (openings) of the shaping aperture array substrate 203.

Next, the operation of the pattern writing mechanism 150 in the pattern writing apparatus 100 will be described. The electron beam 200 emitted from the electron gun assembly 201 (emission source) illuminates the pre-shaping aperture array substrate 224 (first shaping aperture array substrate) as a whole almost vertically through the illumination lens 202. The pre-shaping aperture array substrate 224 has the plurality of holes 23 (first openings) formed in a rectangular shape and the electron beam 200 illuminates a region including all the plurality of holes 23. A plurality of electron beams (temporary multiple beams) 20a to 20e in, for example, a rectangular shape is formed by each portion of the electron beam 200 with which the positions of the plurality of holes 23 are irradiated being passed through each of the plurality of holes 23 of the pre-shaping aperture array substrate 224. The multiple beams 20 are converged by the electromagnetic lens 212 and passing of, for example, scattered electrons deviating from the convergent point is limited by the limiting aperture substrate 216 (first limiting aperture member) arranged in the convergent position. Accordingly, electrons scattered by the pre-shaping aperture array substrate 224 are shielded. Thus, intrusion of scattered electrons downstream therefrom can be prevented. Then, the multiple beams 20 whose scattered electrons are cut off by the limiting aperture substrate 216 are projected by the electromagnetic lens 214 in a direction almost perpendicular to the shaping aperture array substrate 203.

Here, the electromagnetic lenses 212, 214 are excited by the lens control circuit 120 such that magnetic fields are in opposite directions and have the same magnitude. Accordingly, multiple beams having passed through the electromagnetic lens 212 can avoid rotating when passing through the electromagnetic lens 214. Also, distortion can be decreased by forming an antisymmetric doublet lens of equal magnification as described above. Because of the equal magnification, the limiting aperture substrate 216 is ideally arranged in just an intermediate position between the electromagnetic lens 212 and the electromagnetic lens 214.

The shaping aperture array substrate 203 (second shaping aperture array substrate) has the plurality of holes 22 (second openings) formed in a rectangular shape and the plurality of electron beams (temporary multiple beams) 20a to 20e projected by the electromagnetic lens 214 is formed into the plurality of electron beams (multiple beams) 20a to 20e in, for example, a rectangular shape of a desired size by passing through the respective corresponding holes 22 of the plurality of holes 22 (second openings) of the shaping aperture array substrate 203. In other words, at least a portion of the corresponding beam of the multiple beams 20a to 20e passes through each of the plurality of holes 22 of the shaping aperture array substrate 203 (second shaping aperture array substrate). In other words, an aperture array image (first aperture array image) having passed through the pre-shaping aperture array substrate 224 (first aperture array substrate) is formed on the shaping aperture array substrate 203 (second aperture array substrate) by a lens action including a magnetic field distribution in which magnetic fields having the opposite signs of the magnetic field and the same magnitude and generated between the pre-shaping aperture array substrate 224 (first aperture array substrate) and the shaping aperture array substrate 203 (second aperture array substrate) continue and an electric field distribution generated by the grating lens 220.

Here, positional displacements in the direction of rotation with respect to the shaping aperture array substrate 203 downstream of the temporary multiple beams 20a to 20e are adjusted by operating a rotating mechanism of the pre-shaping aperture array substrate 224. Alternatively, rotational displacements can be adjusted by providing a magnetic lens for rotation adjustments. However, when the magnetic lens is used, symmetry of the magnetic field breaks down and distortion aberration increases and thus, adjustments may be made within a practically feasible range.

Here, the number of convergent points (crossover) of the multiple beams 20a to 20e can be decreased by determining the beam shape by the shaping aperture array substrate 203 on the downstream side, instead of the pre-shaping aperture array substrate 224 on the upstream side. Thus, the optical system can be prevented from being made more complex. When the beam shape is determined by the pre-shaping aperture array substrate 224 side, each beam passes through the shaping aperture array substrate 203 on the downstream side without hitting the shaping aperture array substrate 203 and thus, the generation of scattered electrons when passing through the shaping aperture array substrate 203 can advantageously be suppressed.

The multiple beams 20a to 20e having passed through the shaping aperture array substrate 203 pass through the respective corresponding blankers (first deflector: individual blanking mechanism 47) of the blanking aperture array mechanism 204 (another example of the second aperture array substrate). Such blankers individually deflect (deflect by blanking) the passing electron beam 20.

The multiple beams 20a to 20e having passed through the blanking aperture array mechanism 204 are converged by the reducing lens 205 (electromagnetic lens). In other words, the reducing lens 205 converges the multiple beams 20a to 20e having passed through the shaping aperture array substrate 203. When passing, the size of images of the multiple beams 20a to 20e is reduced by the reducing lens 205. The multiple beams 20a to 20e having been refracted by the reducing lens 205 (electromagnetic lens) in a convergence direction advances toward the hole in the center formed in the limiting aperture substrate 206. The limiting aperture substrate 206 (second limiting aperture member) is arranged in the convergent point position of the multiple beams 20a to 20e converged by the reducing lens 205 to limit passing of the electron beam 20 deviating from the convergent point of the multiple beams 20a to 20e. Here, the electron beam 20 deflected by the blanker of the blanking aperture array mechanism 204 deviates from the position of the hole in the center of the limiting aperture substrate 206 and is shielded by the limiting aperture substrate 206. On the other hand, the electron beam 20 that is not deflected by the blanker of the blanking aperture array mechanism 204 passes, as shown in FIG. 1, through the hole in the center of the limiting aperture substrate 206. Blanking control is exercised by ON/OFF of the individual blanking mechanism 47 to control ON/OFF of a beam. In this manner, the limiting aperture substrate 206 shields each beam deflected so as to be in a beam OFF state by the individual blanking mechanism 47. Then, a beam for one shot is formed for each beam by a beam formed between beam ON and beam OFF and having passed through the limiting aperture substrate 206. The multiple beams 20 having passed through the limiting aperture substrate 206 are focused on the surface of the target object 101 by the objective lens 207 and become a pattern image of a desired reduction ratio and each beam (multiple beams 20 as a whole) having passed through the limiting aperture substrate 206 is deflected collectively in the same direction by the deflector 208 and targeted at the irradiation position of each beam on the target object 101. In other words, the target object 101 placed on that XY stage 105 that can move continuously receives irradiation of a beam group being at least a portion of the multiple beams 20a to 20e having passed through the doublet lens. When, for example, the XY stage 105 moves continuously, the irradiation position of a beam is controlled by the deflector 208 so as to track the movement of the XY stage 105. The position of the XY stage 105 is measured by aiming a laser from a stage position detector (not shown) at a mirror (not shown) on the XY stage 105 and using a reflected light thereof. The multiple beams 20 emitted at a time are ideally arranged with pitches obtained by multiplying the arrangement pitch of the plurality of holes 22 of the shaping aperture array substrate 203 by the above desired reduction ratio. The pattern writing apparatus 100 performs a pattern writing operation in which the multiple beams 20 to be a shot beam are in turn emitted pixel by pixel along a pattern writing sequence by moving the beam deflection position by the deflector 208 while tracking the movement of the XY stage 105 during each tracking operation. When a desired pattern is written, a needed beam is controlled to beam ON by blanking control in accordance with the pattern.

The position of the plane (x, y axes) orthogonal to the optical axis (z axis) of the multiple beams 20 may be adjusted by each z position using the alignment coils 242, 244, 246, 248. Particularly, the alignment coils 244, 246 arranged between the electromagnetic lenses 212, 214 constituting the doublet lens are arranged in a position symmetric with respect to the limiting aperture substrate 216. Then, secondary electrons including reflected electrons emitted by the multiple beams 20 with which the limiting aperture substrate 216 from the limiting aperture substrate 216 are detected by the detector 249 and the position of the center of the multiple beams 20 is detected by a detection circuit (not shown). Then, using such a detection result, the alignment coils 244, 246 are controlled by a lens control circuit (not shown) such that the position of the convergent point of the multiple beams 20 is matched to the position of an opening of the limiting aperture substrate 216. With the arrangement of the alignment coils 244, 246 in two stages in positions symmetric with respect to the limiting aperture substrate 216, the position of an image can be corrected without the image being rotated.

Figure 5:
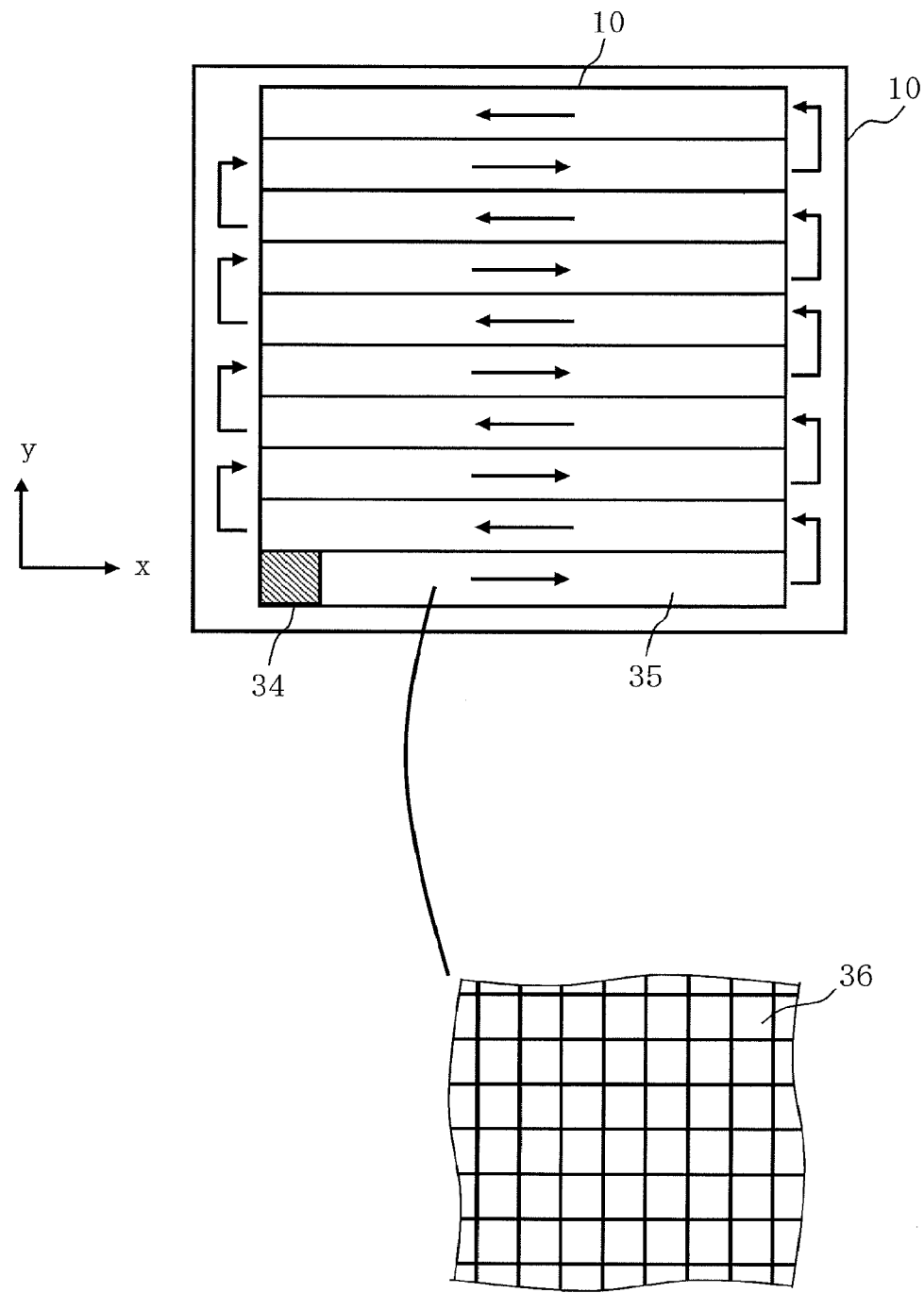
FIG. 5 is a diagram illustrating a pattern writing order according to Embodiment 1.

FIG. 5 is a diagram illustrating a pattern writing order according to Embodiment 1. A pattern writing region 10 (or a chip region into which a pattern is written) of the target object 101 is divided into stripe regions 35 (another example of the pattern writing region) of a thinly rectangular shape of a predetermined width. Then, each of the stripe regions 35 is divided into a plurality of mesh pixel regions 36 (pixels). The size of the pixel region 36 (pixel) is suitably, for example, a size equal to the beam size or less. For example, the size is suitably set to about 10 nm. The pixel region 36 (pixel) becomes the beam irradiation unit region per beam of multiple beams.

When writing a pattern on the target object 101 using the multiple beams 20, the irradiation region 34 is irradiated with one shot of the multiple beams 20. As described above, the multiple beams 20 to be a shot beam collectively as a whole are in turn emitted successively, for example, pixel by pixel by moving the beam deflection position by the deflector 208 while tracking the movement of the XY stage 105 during tracking operation. Then, which pixel on the target object 101 to irradiate with which beam of multiple beams is determined by a pattern writing sequence. Using beam pitches between beams adjacent in the x and y directions of multiple beams, a region of the beam pitch (x direction)× beam pitch (y direction) between beams adjacent in the x and y directions on the target object 101 surface includes a region (sub-pitch region) of n×n pixels. If, for example, the XY stage 105 moves by the beam pitch (x direction) in the −x direction in one tracking operation, n pixels are written by one beam while shifting the irradiation position in the x direction or the y direction (or a slanting direction). Other n pixels in the region of the same n×n pixels are similarly written by a different beam from the above beam in the next tracking operation. In this manner, all pixels in one region of n×n pixels are written by mutually different beams in n tracking operations, each time n pixels. For other regions of n×n pixels in the irradiation region of multiple beams, similar operations are performed in the same period to similarly write a pattern. Such an operation enables a pattern to be written into all pixels inside the irradiation region 34. By repeating such an operation, a pattern can be written into the corresponding stripe region 35 as a whole. Then, the pattern writing apparatus 100 can write a desired pattern by combining pixel patterns (bit patterns) formed by irradiating necessary pixels with a beam of a necessary dose.

Figure 6:
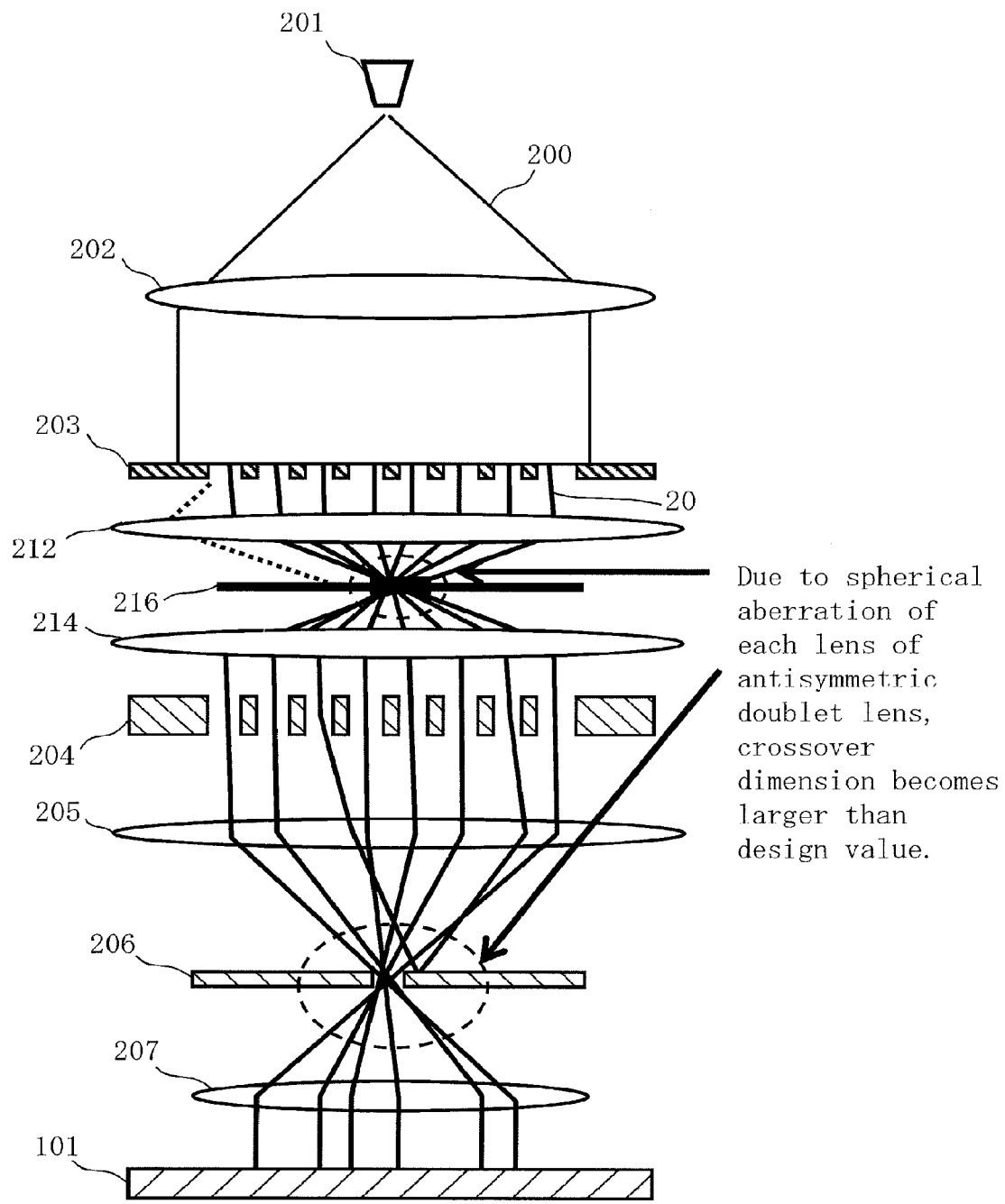
FIG. 6 is a diagram illustrating the configuration according to Comparative Example of Embodiment 1 and an example of a beam trajectory.

FIG. 6 is a diagram illustrating the configuration according to Comparative Example of Embodiment 1 and an example of a beam trajectory. In FIG. 6, Comparative Example is the same as FIG. 1 except that, among components inside the electron optical column 102 shown in FIG. 1, the pre-shaping aperture array substrate 224, the electrostatic lens 222, and the electrostatic lens 232 are not arranged and the shaping aperture array substrate 203 is arranged in the position of the pre-shaping aperture array substrate 224. The deflector 208 and the alignment coils 242, 244, 246, 248 are omitted. In Comparative Example, even if the electromagnetic lenses 212, 214 constituting the doublet lens are excited such that magnetic fields are mutually in opposite directions and have the same magnitude, the crossover diameter at the convergent point becomes larger than the design value due to spherical aberration of each of the electromagnetic lenses 212, 214. Due to spherical aberration of the electromagnetic lens 212, the crossover diameter at the convergent point on the surface of the limiting aperture substrate 216 becomes large. Due to spherical aberration of the electromagnetic lens 214, the crossover diameter at the convergent point on the surface of the limiting aperture substrate 206 becomes large.

In Embodiment 1, by contrast, grating lenses 220, 230 generate spherical aberration having negative aberration coefficients. Accordingly, the spherical aberration of the electromagnetic lenses 212, 214 is canceled each other. Electromagnetic lenses such as the illumination lens 202, the reducing lens 205, and the objective lens 207 including the electromagnetic lenses 212, 214 all act as a convex lens that refracts the multiple beams 20 toward the inner side (center side of the optical axis) of the lens. Thus, the grating lenses 220, 230 cancel a spherical aberration action generated by the electromagnetic lenses 212, 214 and so act conversely as a concave lens that refracts the multiple beams 20 toward the outer side of the lens.

Figure 7:
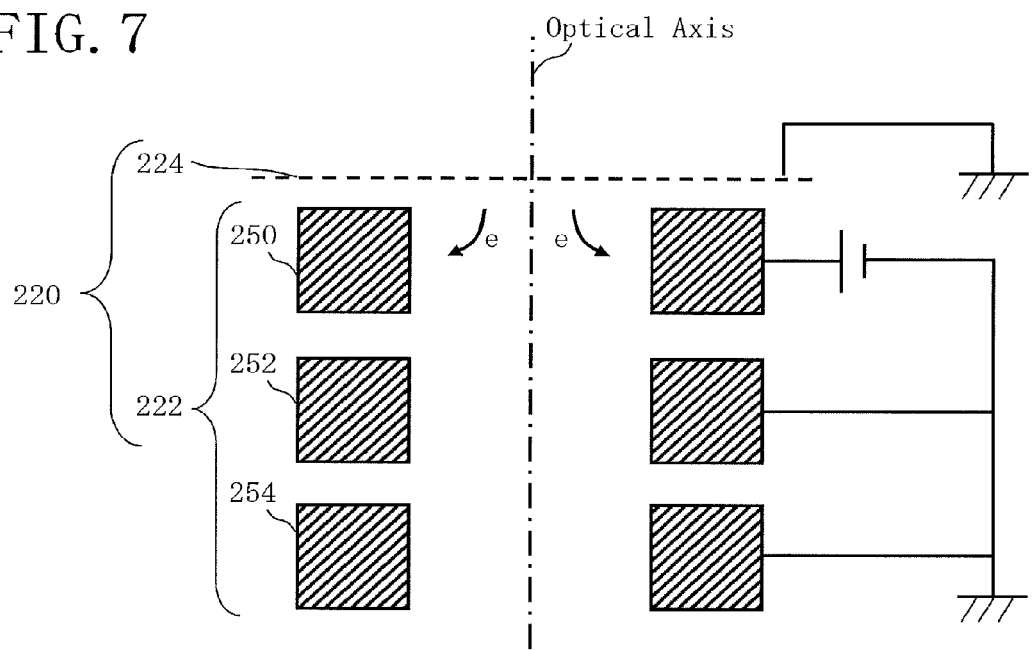
FIG. 7 is a diagram showing the configuration of a grating lens upstream of a doublet lens according to Embodiment 1 and an example of an electron trajectory.

FIG. 7 is a diagram showing the configuration of a grating lens upstream of a doublet lens according to Embodiment 1 and an example of an electron trajectory. The electrostatic lens 222 constituting the grating lens 220 on the upstream side of the doublet lens includes, as shown in FIG. 7, a plurality of stages, for example, three stages of ring electrodes 250, 252, 254. In a common electrostatic lens, a positive potential is applied to, among the three stages of ring electrodes 250, 252, 254, the ring electrode 252 in the middle stage and the ring electrodes 250, 254 in the upper and lower stages are controlled to the ground potential. Accordingly, a convex lens is formed.

In the electrostatic lens 222 according to Embodiment 1, by contrast, as shown in FIG. 7, a positive potential is applied to the ring electrode 250 in the upper stage closest to the pre-shaping aperture array substrate 224 and the ring electrodes 252, 254 in the middle and lower stages are controlled to the ground potential. For example, a conductor (or a semiconductor) such as a silicon (Si) substrate is used for the pre-shaping aperture array substrate 224. Then, the pre-shaping aperture array substrate 224 has the plurality of holes 23 formed two-dimensionally and such an array acts gratings. Further, the pre-shaping aperture array substrate 224 is ground-connected to maintain the pre-shaping aperture array substrate 224 at the ground potential. Accordingly, an electric field generated by the illumination lens 202 on the upstream side or the like can once be discontinued by the pre-shaping aperture array substrate 224. Thus, a new electric field having the surface of the pre-shaping aperture array substrate 224 as a starting point (ground potential) can be formed downstream of the pre-shaping aperture array substrate 224. Then, by arranging the electrostatic lens 222 including a plurality of stages configured as shown in FIG. 7, for example, three stages of the ring electrodes 250, 252, 254, electrons (e) having passed through the pre-shaping aperture array substrate 224 are attracted to the outer side by the ring electrode 250 and electrons are refracted to the outer side by the electrostatic lens 222 as a whole. Accordingly, a concave lens can be formed. If there is no substrate-shaped member acting as a grating, the electric field is not discontinued and thus, it is difficult to form a convex lens.

Figure 8:
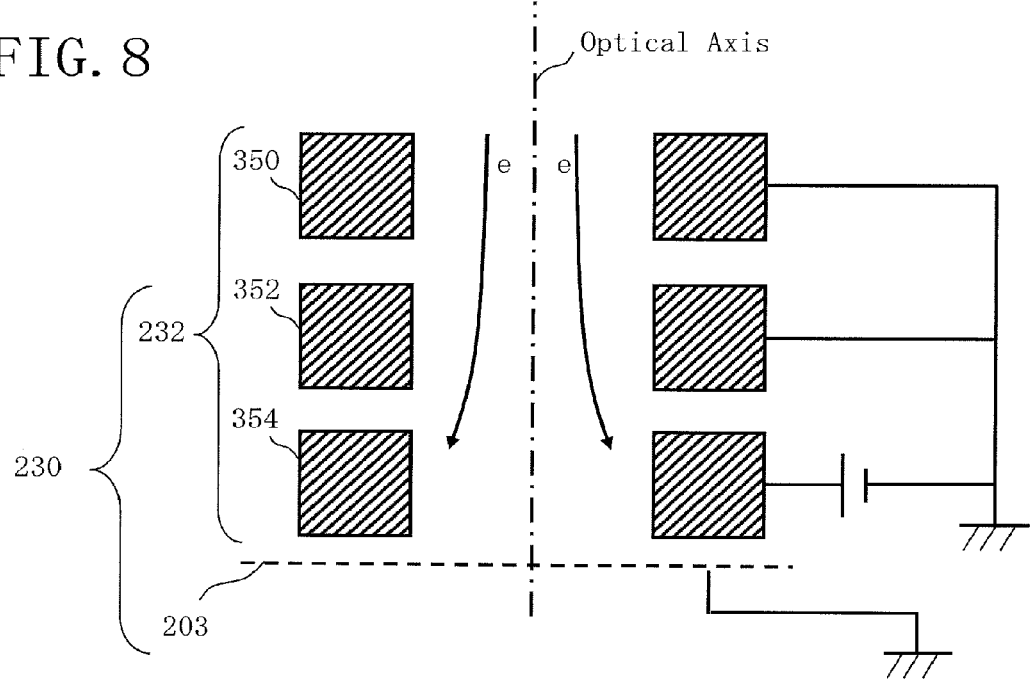
FIG. 8 is a diagram showing the configuration of a grating lens downstream of the doublet lens according to Embodiment 1 and an example of the electron trajectory.

FIG. 8 is a diagram showing the configuration of a grating lens downstream of the doublet lens according to Embodiment 1 and an example of the electron trajectory. The electrostatic lens 232 constituting the grating lens 230 on the downstream side of the doublet lens includes, as shown in FIG. 8, a plurality of stages, for example, three stages of ring electrodes 350, 352, 354. In a common electrostatic lens, as described above, a positive potential is applied to, among the three stages of ring electrodes 350, 352, 354, the ring electrode 352 in the middle stage and the ring electrodes 350, 354 in the upper and lower stages are controlled to the ground potential. Accordingly, a convex lens is formed.

In the electrostatic lens 232 according to Embodiment 1, by contrast, as shown in FIG. 8, a positive potential is applied to the ring electrode 354 in the lower stage closest to the shaping aperture array substrate 203 and the ring electrodes 350, 352 in the upper and middle stages are controlled to the ground potential. For example, a conductor (or a semiconductor) such as a silicon (Si) substrate is used for the shaping aperture array substrate 203. Then, the shaping aperture array substrate 203 has the plurality of holes 22 formed two-dimensionally and such an array acts as a grating. Further, the shaping aperture array substrate 203 is ground-connected to maintain the shaping aperture array substrate 203 at the ground potential. Accordingly, an electric field generated by the reducing lens 205 on the downstream side or the like can once be discontinued by the shaping aperture array substrate 203. Thus, a new electric field having the surface of the shaping aperture array substrate 203 as a starting point (ground potential) can be formed upstream of the shaping aperture array substrate 203. Then, by arranging the electrostatic lens 232 including a plurality of stages configured as shown in FIG. 8, for example, three stages of the ring electrodes 350, 352, 354, electrons (e) having passed through the doublet lens are attracted to the outer side by an electric field formed between the ring electrodes 350, 352, 354 and the shaping aperture array substrate 203 and refracted to the outer side by the electrostatic lens 232 as a whole. Accordingly, a concave lens can be formed. If there is no substrate-shaped member acting as a grating, the electric field is not discontinued and thus, it is difficult to form a convex lens under the influence of action of a downstream electric field.

Figure 9:
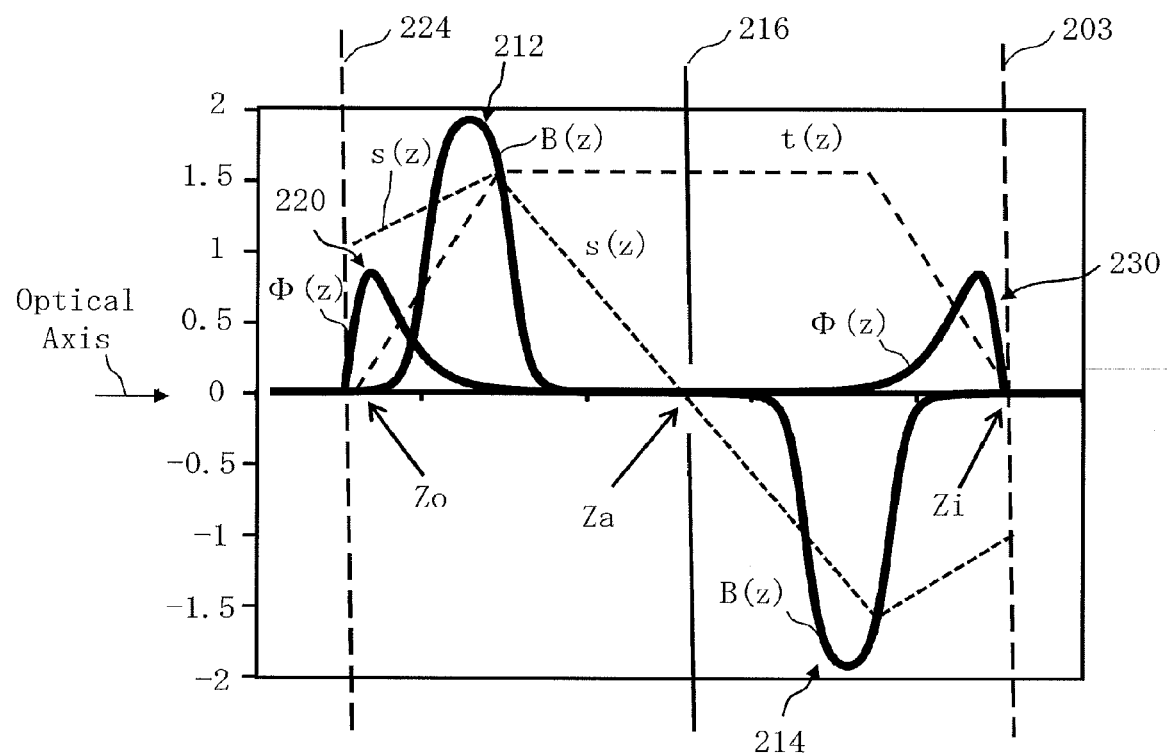
FIG. 9 is a diagram showing an example of simulation results of an axial magnetic field distribution, an axial potential distribution, and a paraxial trajectory according to Embodiment 1.

FIG. 9 is a diagram showing examples of an axial magnetic field distribution, an axial potential distribution, and a paraxial trajectory according to Embodiment 1. In FIG. 9, examples of an electrostatic potential on axis $\varphi(z)$, an axial magnetic field $B(z)$ on axis, and paraxial trajectories $s(z)$, $t(z)$ in a space between the pre-shaping aperture array substrate 224 and the shaping aperture array substrate 203 are shown. Here, the electrostatic potential on axis $\varphi(z)$, the axial magnetic field $B(z)$, and the paraxial trajectories $s(z)$, $t(z)$ are intended for describing the principle and are not exact. z shows the position on the z axis along the optical axis. By carrying out antisymmetric excitation in which the electromagnetic lens 212 and the electromagnetic lens 214 constituting the doublet lens are excited in such a way that magnetic fields are in opposite directions and have the same magnitude, as shown in FIG. 9, the axial magnetic field $B(z)$ under the influence of the electromagnetic lens 212 and the axial magnetic field $B(z)$ under the influence of the electromagnetic lens 214 are in opposite directions and have the same magnitude. Such magnetic fields $B(z)$ are not discontinued by the pre-shaping aperture array substrate 224 and the shaping aperture array substrate 203. In contrast, the electric field calculated from the electrostatic potential on axis $\varphi(z)$ under the influence of the grating lens 220 is discontinued on the surface of the pre-shaping aperture array substrate 224. Similarly, the electric field calculated from the electrostatic potential on axis $\varphi(z)$ under the influence of the grating lens 230 is discontinued on the surface of the shaping aperture array substrate 203. In Embodiment 1, the pre-shaping aperture array substrate 224 and the shaping aperture array substrate 203 are controlled by the lens control circuits 122, 124 such that the potential distribution therebetween is symmetric with respect to a height position za of the limiting aperture substrate 216.

Figure 10:
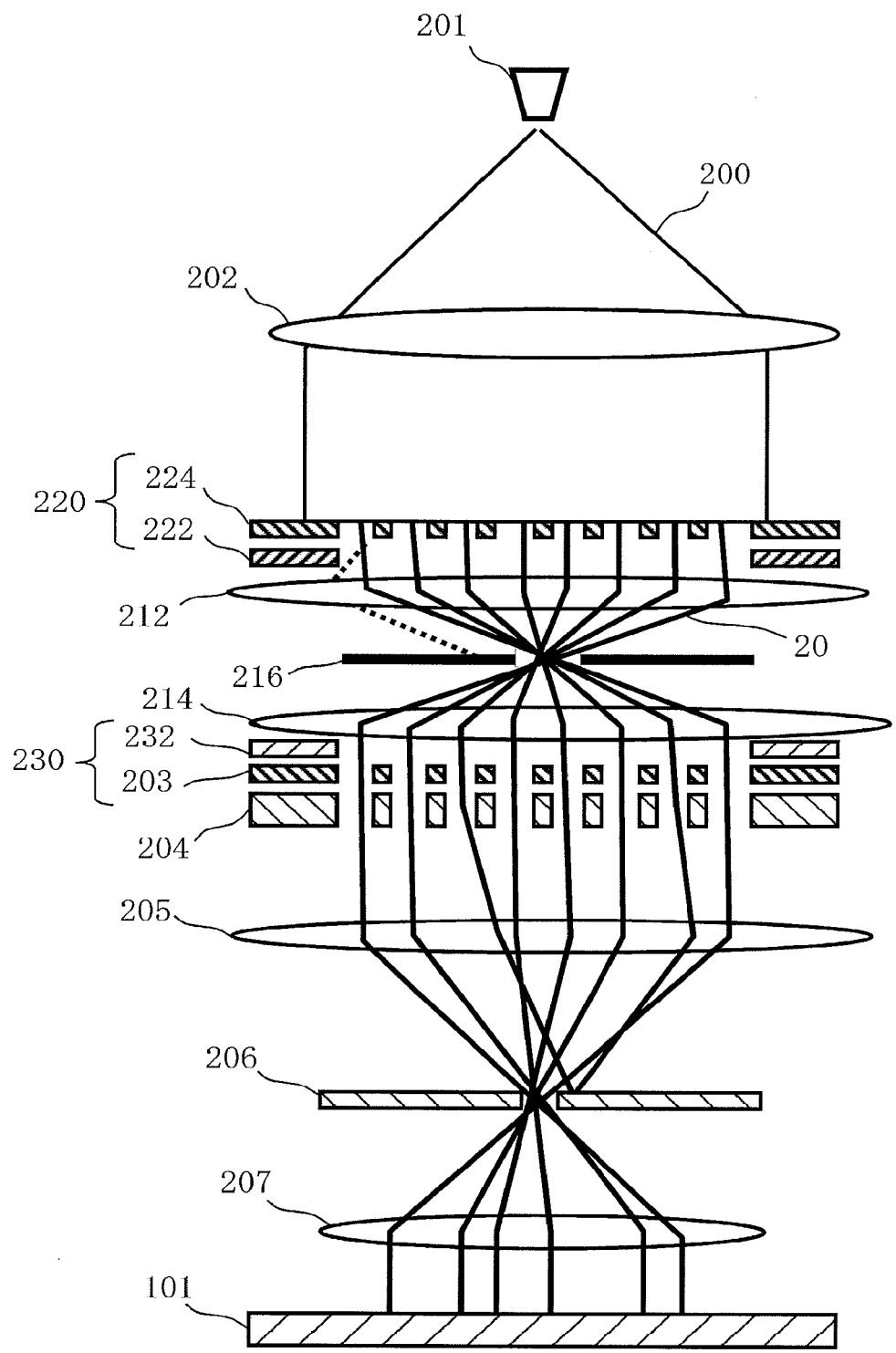
FIG. 10 is a diagram illustrating the configuration according to Embodiment 1 and an example of the beam trajectory.

FIG. 10 is a diagram illustrating the configuration according to Embodiment 1 and an example of the beam trajectory.

In FIG. 10, the deflector 208 and the alignment coils 242, 244, 246, 248 are omitted. By arranging the grating lens 220 acting on a concave lens, spherical aberration generated by the electromagnetic lens 212 constituting the doublet lens can be reduced. As a result, the crossover diameter of the multiple beams 20 on the surface of the limiting aperture substrate 216 broadened by spherical aberration generated by the electromagnetic lens 212 can be decreased. Similarly, by arranging the grating lens 230 acting on a concave lens, spherical aberration generated by the electromagnetic lens 214 constituting the doublet lens can be reduced. As a result, the crossover diameter of the multiple beams 20 on the surface of the limiting aperture substrate 206 broadened by spherical aberration generated by the electromagnetic lens 214 can be decreased. The distortion of the image of 224 on 203 can be small in this field distribution.

According to Embodiment 1, as described above, distortion of the multiple beams 20 can be decreased and also spherical aberration can be corrected without incurring an increase of the distortion after corrections are made. Further, according to Embodiment 1, scattered electrons near the opening of the pre-shaping aperture array substrate 224 can be shielded by the limiting aperture substrate 216. Further, by combining with the limiting aperture substrate 206 provided downstream, the contrast can advantageously be improved still more when compared with a case in which scattered electrons are shielded by the limiting aperture substrate 206 only without the limiting aperture substrate 216.

Embodiment 2

In Embodiment 1, the multiple beams 20 are formed using the two-stage shaping aperture plates of the pre-shaping aperture array substrate 224 and the shaping aperture array substrate 203 and also the grating lenses 220, 230 are arranged by using the pre-shaping aperture array substrate 224 and the shaping aperture array substrate 203 as a grating respectively. However, how to configure the grating lenses 220, 230 is not limited to such a case. In Embodiment 2, a case in which the blanking aperture array mechanism 204 is used as the grating of the grating lens 230 will be described.

Figure 11:
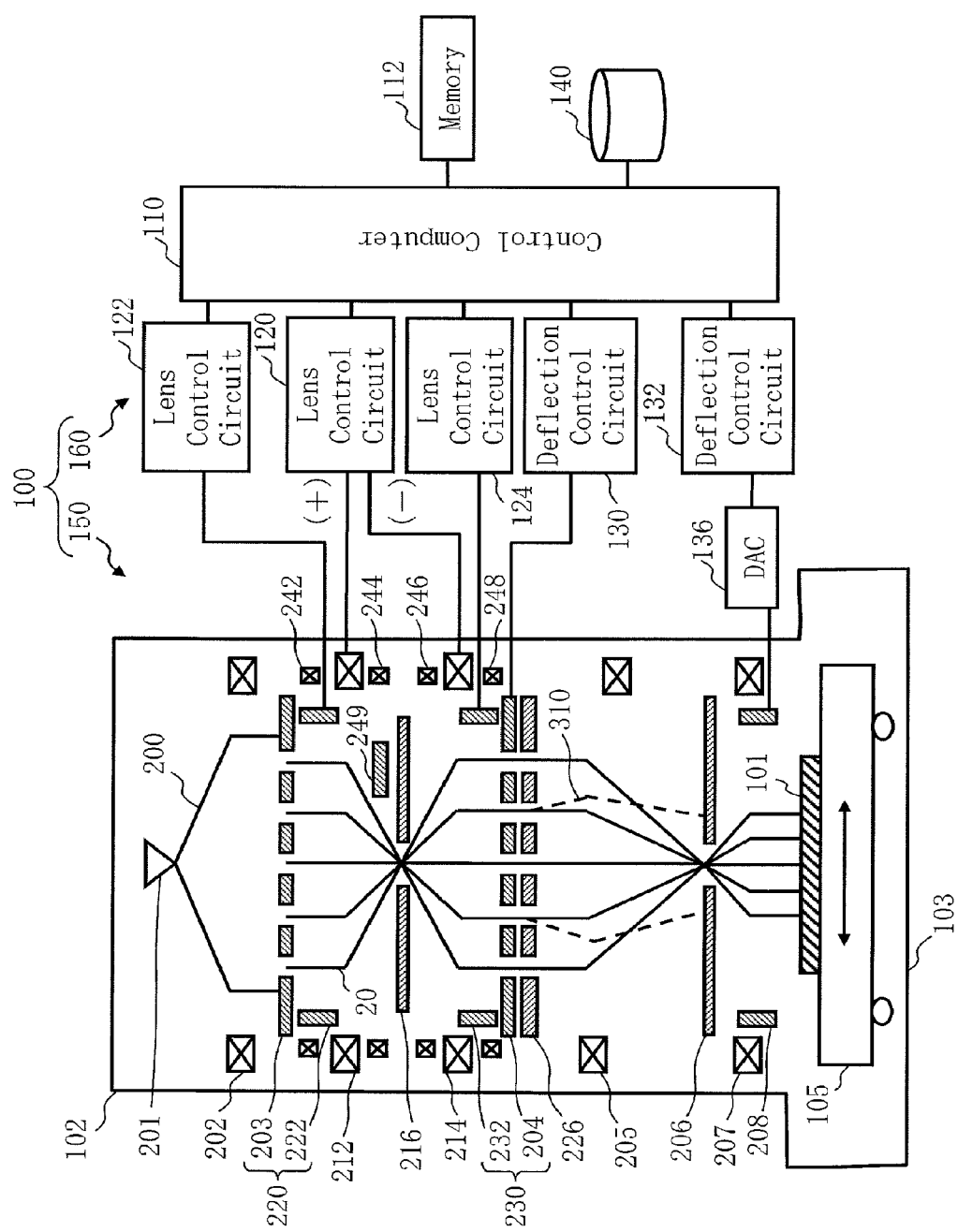
FIG. 11 is a conceptual diagram showing the configuration of the pattern writing apparatus according to Embodiment 2.

FIG. 11 is a conceptual diagram showing the configuration of the pattern writing apparatus according to Embodiment 2. In FIG. 11, instead of the pre-shaping aperture array substrate 224, the shaping aperture array substrate 203 is arranged. Also, as will be described below, the blanking aperture array mechanism 204 whose top surface is made planar is arranged. Then, a protective aperture array substrate 226 is arranged downstream of the blanking aperture array mechanism 204 (XY stage 105 side). Other portions of the configuration are the same as in FIG. 1.

In FIG. 11, the electrostatic lens 222 is arranged immediately close on the side of the blanking aperture array mechanism 204 on the opposite side of the electron gun assembly 201 with respect to the shaping aperture array substrate 203 (first shaping aperture array substrate or first aperture array substrate). For example, the electrostatic lens 222 is arranged between the shaping aperture array substrate 203 and the electromagnetic lens 212 constituting the doublet lens upstream of the optical axis. Then, the electrostatic lens 222 constitutes the grating lens 220 (first grating lens) using the shaping aperture array substrate 203 as a grating. The grating lens 220 constitutes a concave lens like, of the above content, the content in which the pre-shaping aperture array substrate 224 is replaced by the shaping aperture array substrate 203.

Also in Embodiment 2, with the shaping aperture array substrate 203 moved upstream of the doublet lens on the optical axis, in FIG. 11, the electrostatic lens 232 is arranged immediately close on the side of the doublet lens constituted of the electromagnetic lenses 212, 214 with respect to the blanking aperture array mechanism 204 (second aperture array substrate). Then, the electrostatic lens 232 constitutes the grating lens 230 (second grating lens) using the blanking aperture array mechanism 204 as a grating. The grating lens 230 constitutes a concave lens like, of the above content, the content in which the shaping aperture array substrate 203 is replaced by the blanking aperture array mechanism 204. Thus, in Embodiment 2, the shaping aperture array substrate 203 and the blanking aperture array mechanism 204 are controlled by the lens control circuits 122, 124 such that the potential distribution therebetween is symmetric with respect to the height position za of the limiting aperture substrate 216.

If a pair (blanker: blanking deflector) of the control electrode 24 and the counter electrode 26 for blanking deflection is arranged, as shown in FIG. 3, in the membrane region 30 in the center of the substrate 31 across the relevant passing hole 25 in the configuration of the blanking aperture array mechanism 204, an electrode group is placed on the top surface of the blanking aperture array mechanism 204 (top surface of the membrane region 30) and so the top surface becomes uneven and is not planar. To avoid the distortion of the electric field which may deteriorate the grating lens's concave lens function, the surface of the grating lens 230 that discontinues the electric field is desirably planar.

Figure 12:
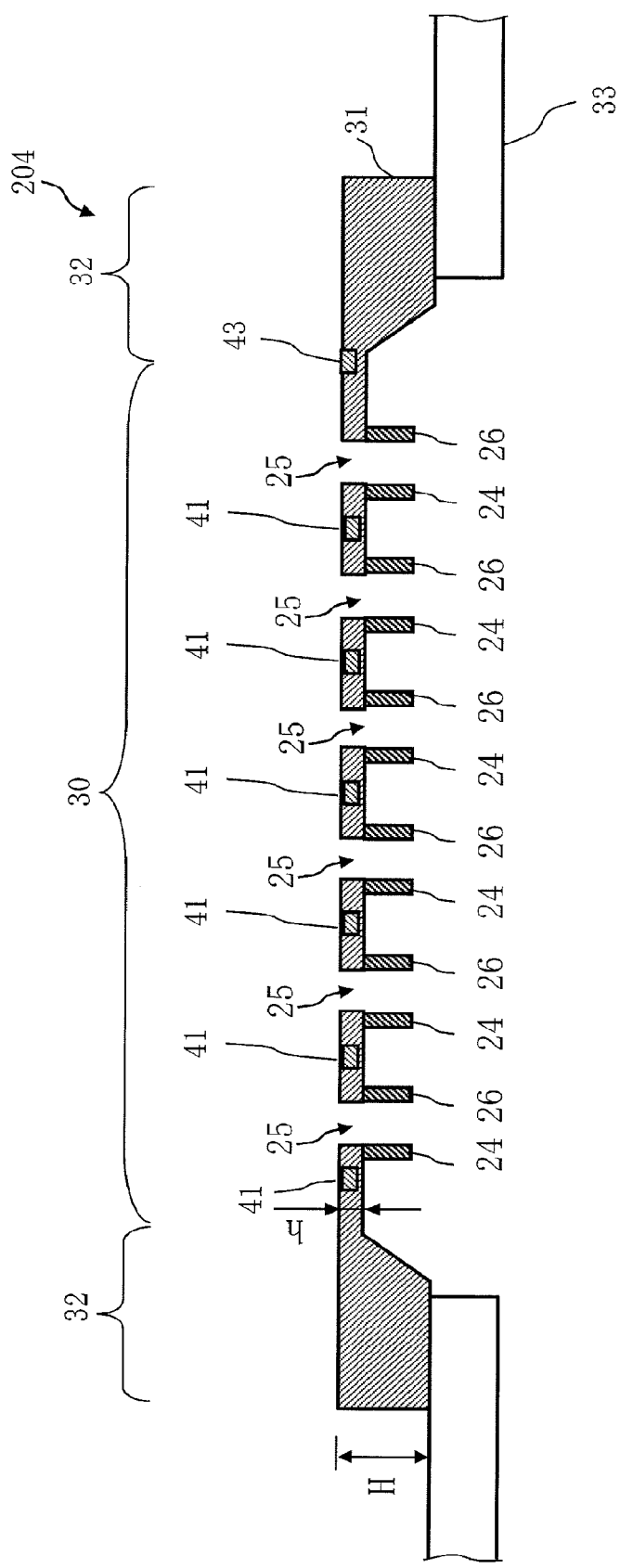
FIG. 12 is a sectional view showing the configuration of a blanking aperture array mechanism according to Embodiment 2.

FIG. 12 is a sectional view showing the configuration of a blanking aperture array mechanism according to Embodiment 2. In the blanking aperture array mechanism 204 according to Embodiment 2, as shown in FIG. 12, a pair (blanker: blanking deflector) of the control electrode 24 and the counter electrode 26 for blanking deflection is arranged on the undersurface of the membrane region 30, instead of in the membrane region 30, across the passing hole 25 corresponding to a neighborhood position of each of the passing holes 25. Also, the control circuit 41 (logic circuit) that applies a deflecting voltage to the control electrode 24 for each of the passing holes 25 is arranged in the neighborhood of each of the passing holes 25 in the membrane region 30. The counter electrode 26 for each beam is ground-connected. Otherwise, FIG. 12 is the same as FIG. 3. By arranging, as shown in FIG. 12, a pair of the control electrode 24 and the counter electrode 26 on the undersurface of the membrane region 30, instead of in the membrane region 30, the top surface of the substrate 31 (top surface of the membrane region 30) can be made a plane in which the plurality of passing holes 25 is formed two-dimensionally. A pair of the control electrode 24 and the counter electrode 26 is exposed to an electron optics space inside the electron optical column 102 by arranging the pair of the control electrode 24 and the counter electrode 26 on the undersurface of the membrane region 30 and so an electric field generated by some pair of electrodes can be prevented from affecting trajectories of electrons passing between other pairs of electrodes by covering the control electrode 24 and the counter electrode 26 with the protective aperture array substrate 226.

According to Embodiment 2, even if configured as described above, by arranging the grating lens 220 acting on a concave lens, spherical aberration generated by the electromagnetic lens 212 constituting the doublet lens can be reduced while a state in which distortion of multiple beams is reduced by the electromagnetic lens 212 being maintained. As a result, the crossover diameter of the multiple beams 20 on the surface of the limiting aperture substrate 216 broadened by spherical aberration generated by the electromagnetic lens 212 can be decreased. Similarly, by arranging the grating lens 230 acting on a concave lens, spherical aberration generated by the electromagnetic lens 214 constituting the doublet lens can be reduced while a state in which distortion of multiple beams is reduced by the electromagnetic lens 214 being maintained. As a result, the crossover diameter of the multiple beams 20 on the surface of the limiting aperture substrate 206 broadened by spherical aberration generated by the electromagnetic lens 214 can be decreased.

Embodiment 3

In Embodiments 1, 2 described above, a case in which the position of the convergent point is adjusted using the alignment coils 242, 244, 246, 248, particularly the alignment coils 244, 246 is described, but the present disclosure is not limited to such an example.

Figure 13:
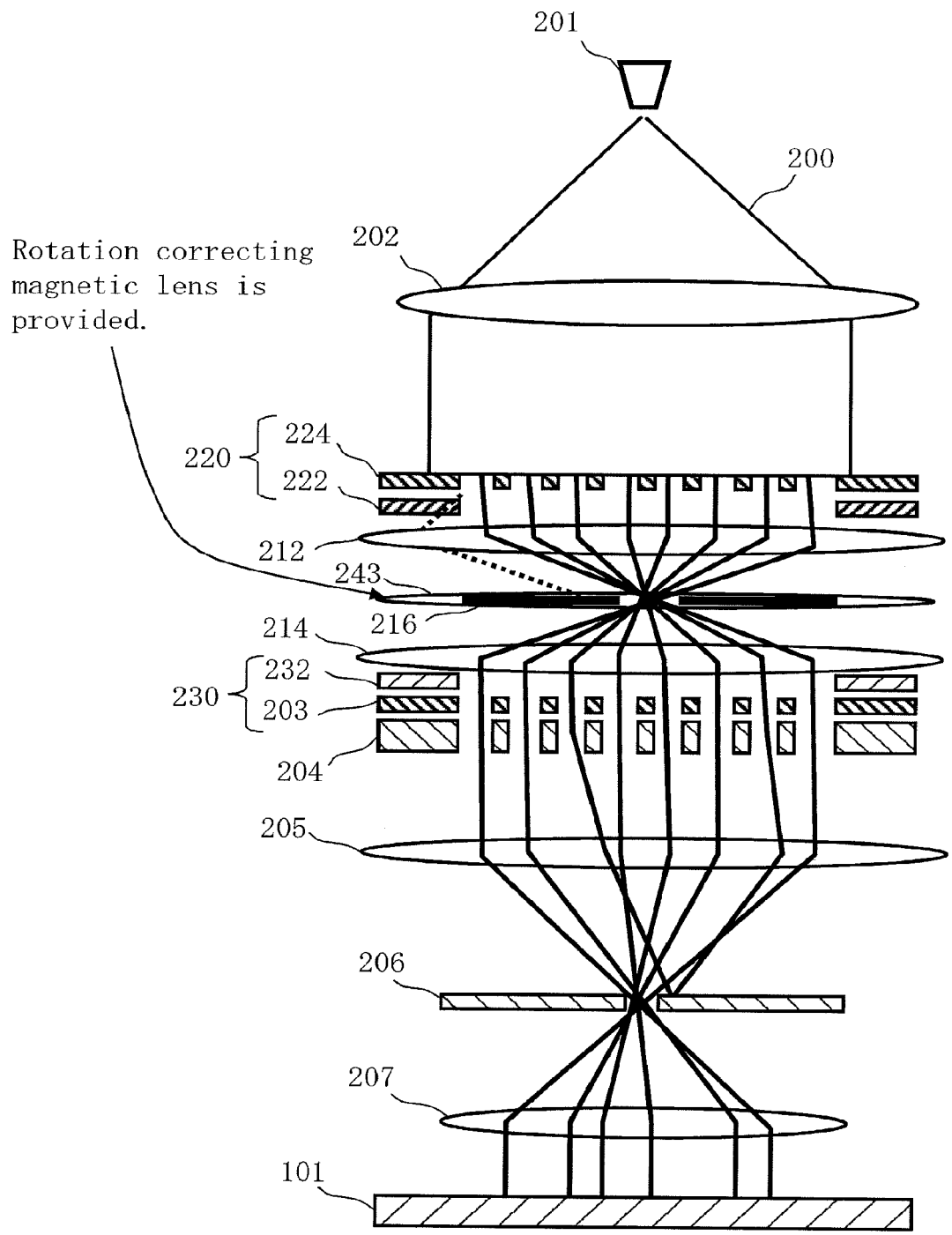
FIG. 13 is a diagram illustrating the configuration according to Embodiment 3 and an example of the beam trajectory.

FIG. 13 is a diagram illustrating the configuration according to Embodiment 3 and an example of the beam trajectory; In FIG. 13, the deflector 208, the detector 249, the alignment coils 242, 248, and the control system circuit 160 are omitted. In FIG. 13, instead of the alignment coils 244, 246, a rotation correcting magnetic lens 243 is arranged such that the center height of a magnetic field by the rotation correcting magnetic lens 243 is in a position substantially as high as the surface of the limiting aperture substrate 216. Otherwise, FIG. 13 is the same as FIG. 1.

the rotation correcting magnetic lens 243 is controlled by a lens control circuit (not shown). The orientation of an image can be corrected by the rotation correcting magnetic lens 243. Other content is the same as that in Embodiment 1 or Embodiment 2.

Embodiment 4

In Embodiments 1, 2 described above, a case in which the position of the convergent point is adjusted using the alignment coils 244, 246 is described.

Figure 14:
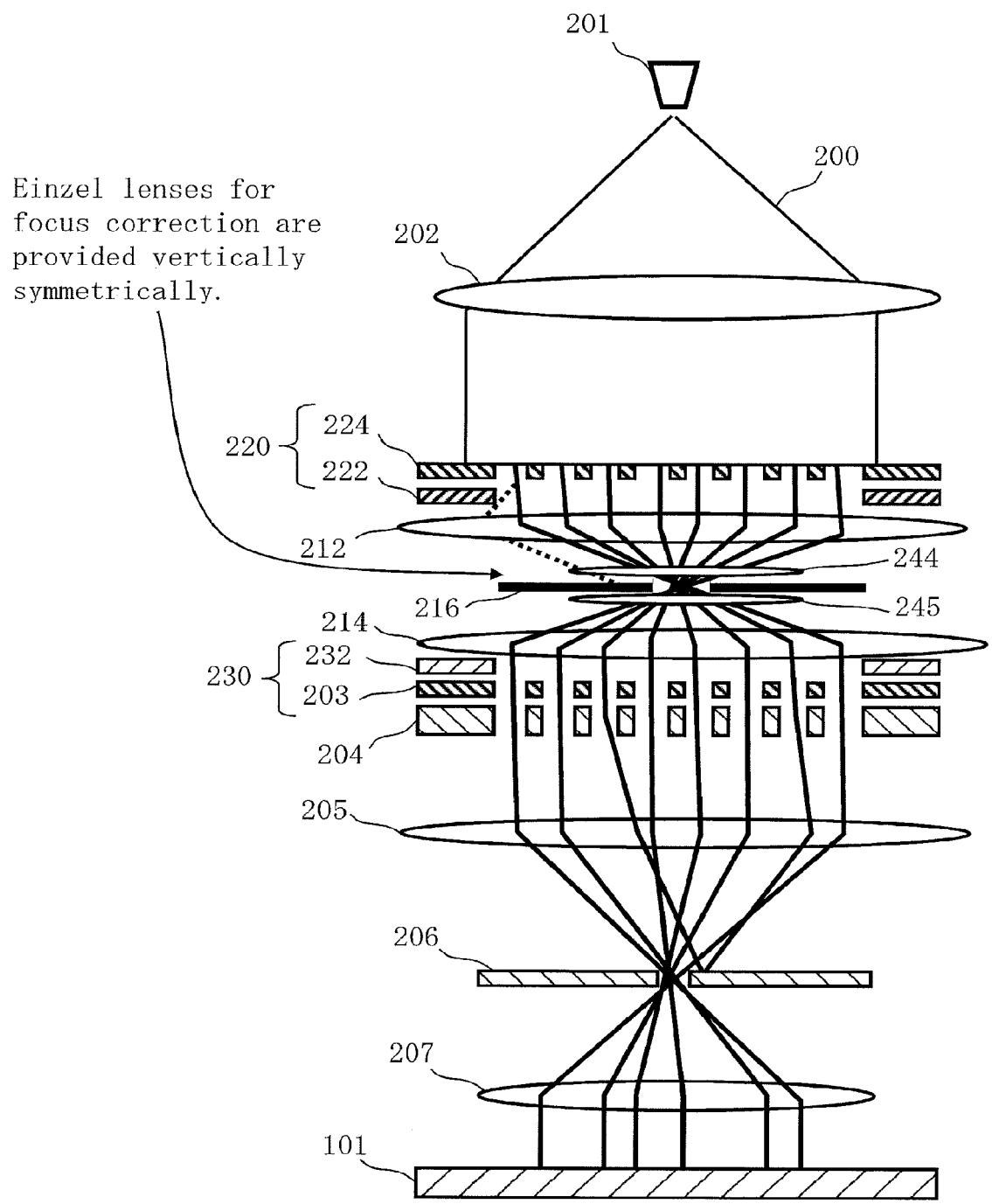
FIG. 14 is a diagram illustrating the configuration according to Embodiment 4 and an example of the beam trajectory.

FIG. 14 is a diagram illustrating the configuration according to Embodiment 4 and an example of the beam trajectory. In FIG. 14, the deflector 208, the detector 249, the alignment coils 242, 248, and the control system circuit 160 are omitted. In FIG. 14, instead of the alignment coils 244, 246, two einzel lenses 244, 245 for focus correction are arranged in a position symmetric with respect to the limiting aperture substrate 216 between the electromagnetic lenses 212, 214 constituting the doublet lens. Otherwise, FIG. 14 is the same as FIG. 1.

Using detection results by the detector 249, the einzel lenses 244, 245 for focus correction are controlled by the lens control circuit such that the position of the convergent point of the multiple beams 20 is matched to the position of an opening of the limiting aperture substrate 216. An image forming position can be corrected by the einzel lenses 244, 245 for focus correction with almost no rotation of the image. Other content is the same as that in Embodiment 1, Embodiment 2, or Embodiment 3. No rotation occurs when the electric field distribution by the einzel lenses 244, 245 is symmetric with respect to the limiting aperture plate and the magnetic field distribution is antisymmetric with respect to the limiting aperture plate.

In FIG. 14, electrodes on both sides of each of the einzel lenses 244, 245, which constitute an electrostatic lens having the same potential at the inlet and the outlet of the lens, are ground-connected. Then, the einzel lenses 244, 245 for focus correction are suitably configured so as to have an axial potential distribution vertically symmetric with respect to the limiting aperture substrate 216 with the limiting aperture substrate 216 functioning as the center electrode. Other content is the same as that in Embodiment 1 or Embodiment 2. In this case, the electric field of the lenses is vertically symmetric and the magnetic field distribution is antisymmetric and thus, focus corrections without image rotation can be made.

Embodiment 5

In Embodiment 2 described above, when the shaping aperture array substrate 203 upstream of the doublet lens is used as a grating of the grating lens 220, the electrostatic lens 222 is arranged on the doublet lens side, but the present disclosure is not limited to such an example. Similarly, when the blanking aperture array mechanism 204 is used as a grating of the grating lens 230, the electrostatic lens 232 is arranged on the doublet lens side, but the present disclosure is not limited to such an example.

Figure 15:
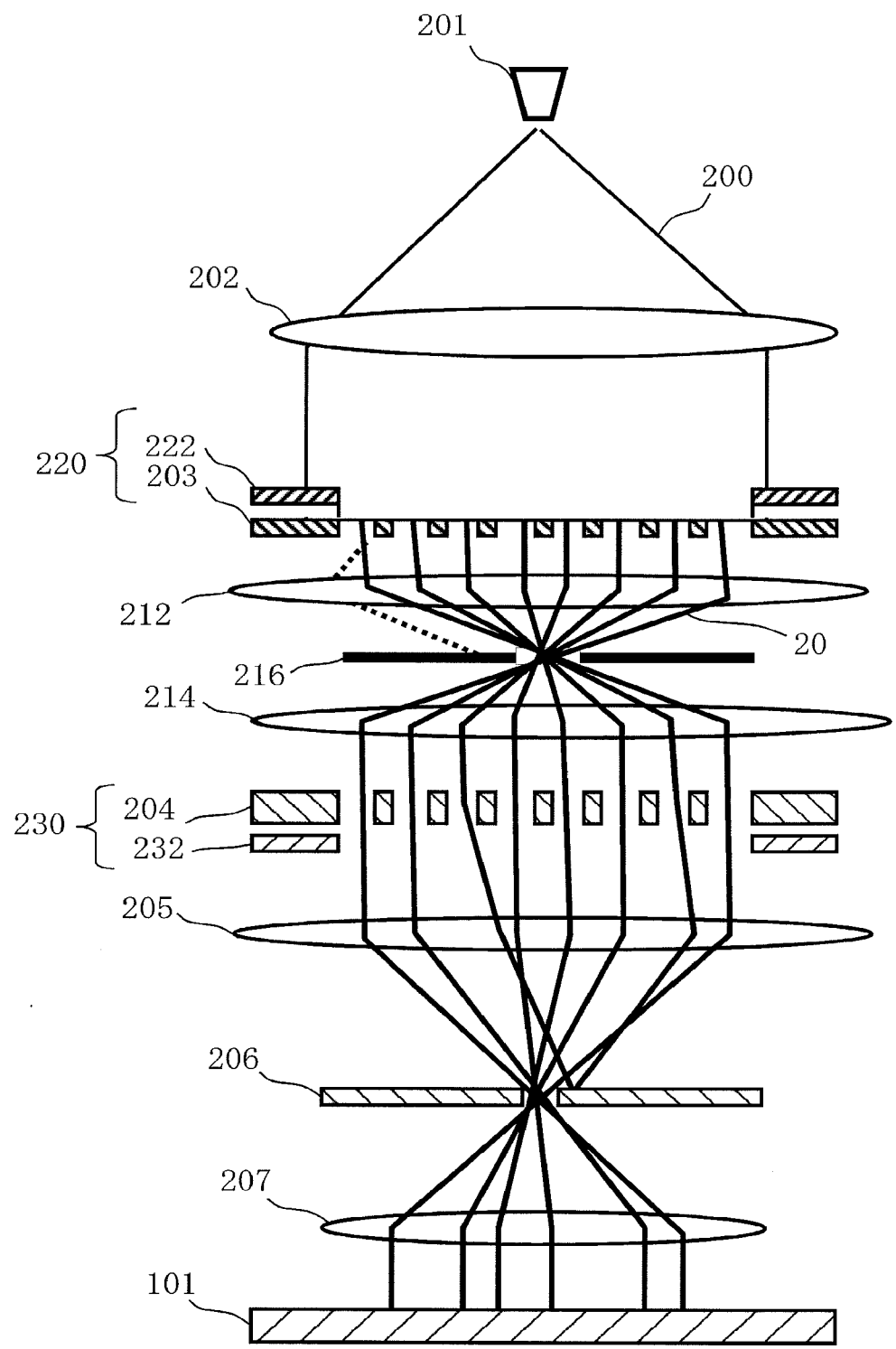
FIG. 15 is a diagram illustrating the configuration according to Embodiment 5 and an example of the beam trajectory.

FIG. 15 is a diagram illustrating the configuration according to Embodiment 5 and an example of the beam trajectory. In FIG. 15, the electrostatic lens 222 constituting the grating lens 220 is arranged upstream of the shaping aperture array substrate 203 on the optical axis (opposite side of the doublet lens side). Like in Embodiment 1, the blanking aperture array mechanism 204 is configured to have a plane undersurface. Then, the electrostatic lens 232 constituting the grating lens 230 is arranged downstream of the blanking aperture array mechanism 204 on the optical axis (opposite side of the doublet lens side). The protective aperture array substrate 226 may not be provided. Other portions of the configuration are the same as in FIG. 11.

In FIG. 15, the electrostatic lens 222 constitutes the grating lens 220 (first grating lens) using the shaping aperture array substrate 203 as a grating. The grating lens 220 constitutes, as described above, a concave lens.

The electrostatic lens 232 constitutes the grating lens 230 (second grating lens) using the blanking aperture array mechanism 204 as a grating. The grating lens 230 constitutes, as described above, a concave lens.

As shown in FIG. 15, the electrode constituting a grating lens can also be arranged on the electron source side with respect to the shaping aperture plate. In this case, symmetry of the electric field distribution between first and second shaping aperture plates can be ensured by providing the electrode of the second grating lens downstream of the second shaping aperture plate.

According to each embodiment, as described above, the inflow of X-rays and electron beams into circuits formed in the blanking aperture array mechanism 204 and the inflow of electron beams (heat load) into the aperture plate can be suppressed. Further, aberration of crossover image forming can be inhibited from growing.

In the foregoing, the embodiments have been described with reference to concrete examples. However, the present embodiment is not limited to the concrete examples. In the above examples, a case in which the grating lenses 220, 230 uses the shaping aperture array substrate 203 (pre-shaping aperture array substrate 224) or the blanking aperture array mechanism 204 is used as a grating is described, but the present disclosure is not limited to such an example. A grating member may separately be provided. Alternatively, a material allowing an electron beam to transmit may be used as foil to arrange, instead of the grating lenses 220, 230, a foil lens to be a concave lens.

Also, even if image forming between the first shaping aperture plate and the second shaping aperture plate is not perfect, image forming shifts are permitted within the permissible range of losses caused by beam blurring.

In the above examples, the pattern writing apparatus 100 is described as an example, but the present disclosure is not limited to the pattern writing apparatus and can be applied to multiple charged particle beam apparatuses in general including inspection apparatuses.

Parts of the apparatus configuration, the control method, and the like which are not needed to be explained directly for the explanation of the present disclosure are not described. However, a necessary apparatus configuration and a necessary control method can be appropriately selected and used. For example, a control unit configuration which controls the pattern writing apparatus 100 is not described. However, a necessary control unit configuration is appropriately selected and used, as a matter of course.

In addition, all multiple charged particle beam apparatuses which include the elements of the present disclosure and can be attained by appropriately changing in design by a person skilled in the art are included in the spirit and scope of the disclosure.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A multiple charged particle beam apparatus comprising:
   an emission source configured to emit a charged particle beam;
   an illumination lens configured to illuminate the charged particle beam;
   a first aperture array substrate that has a plurality of first openings formed therein and receives irradiation of the charged particle beam illuminated in a region including the plurality of first openings as a whole to form multiple beams by making portions of the charged particle beam individually pass through a corresponding one of the plurality of first openings;
   a first grating lens that constitutes a concave lens by using the first aperture array substrate as a grating;
   a second aperture array substrate including a blanker aperture array, and that has a plurality of second openings formed therein and allows at least a portion of a corresponding beam of the multiple beams to pass through each of the plurality of second openings;
   a multiple lens structure located between the first aperture array substrate and the second aperture array substrate;
   a first limiting aperture substrate arranged in a position of a convergent point of the multiple beams between the first aperture array substrate and the second aperture array substrate to limit passing of charged particles deviating from the convergent point; and
   a stage capable of continuously moving on which a target object receiving the irradiation of a beam group being at least a portion of the multiple beams having passed through the second aperture array substrate is placed, wherein
   a first aperture array image having passed through the first aperture array substrate is formed on the second aperture array substrate by a lens action including a magnetic field distribution in which magnetic fields generated between the first aperture array substrate and the second aperture array substrate and having opposite signs and same magnitude continue and an electric field distribution generated by the first grating lens, and
   said first grating lens is arranged so that potential distribution between the first aperture array substrate and the second aperture array substrate is symmetric with respect to a height position of the first limiting aperture substrate, generates spherical aberration having negative aberration coefficients, and forms an image on the first aperture array substrate onto the second aperture array substrate via the first limiting aperture substrate in equal magnification.

2. A multiple charged particle beam apparatus comprising:
   an emission source configured to emit a charged particle beam;
   an illumination lens configured to illuminate the charged particle beam;
   a first shaping aperture array substrate that has a plurality of first openings formed therein and receives irradiation of the charged particle beam illuminated in a region including the plurality of first openings as a whole to form multiple beams by making portions of the charged particle beam individually pass through a corresponding one of the plurality of first openings;
   a first grating lens that constitutes a concave lens by using the first shaping aperture array substrate as a grating;
   a doublet lens arranged on an opposite side of a side of the emission source with respect to the first grating lens and having first and second electromagnetic lenses excited to have magnetic fields with opposite signs and same magnitude;
   a first limiting aperture substrate including a blanker aperture array, and arranged in a position of a first convergent point of the multiple beams between the first and second electromagnetic lenses to limit passing of charged particles deviating from the convergent point;
   a multiple lens structure located between the first aperture array substrate and a second shaping aperture array substrate;
   a stage capable of continuously moving on which a target object receiving the irradiation of a beam group being at least a portion of the multiple beams having passed through the doublet lens is placed; and
   the second shaping aperture array substrate arranged on a side of the stage with respect to the doublet lens, having a plurality of second openings formed therein, and allowing at least portions of the multiple beams to individually pass through a corresponding one of the plurality of second openings,
   wherein said first grating lens is arranged so that potential distribution between the first and second shaping aperture array substrates is symmetric with respect to a height position of the first limiting aperture substrate, generates spherical aberration having negative aberration coefficients, and forms an image on the first shaping aperture array substrate onto the second shaping aperture array substrate via the first limiting aperture substrate in equal magnification.

3. The apparatus according to claim 2, further comprising:
a second grating lens arranged on a side of the doublet lens with respect to the second shaping aperture array substrate and using the second shaping aperture array substrate as a grating to constitute a concave lens;
an electromagnetic lens that converges the multiple beams having passed through the second shaping aperture array substrate; and
a second limiting aperture member arranged in a position of a second convergent point of the multiple beams converged by the electromagnetic lens to limit passing of charged particles deviating from the convergent point of the multiple beams.

4. The apparatus according to claim 1, wherein the first limiting aperture substrate includes a third opening, further comprising:
an alignment coil arranged between the first and second electromagnetic lenses to align the position of the first convergent point of the multiple beams to a position of the third opening of the first limiting aperture substrate.

5. The apparatus according to claim 1, wherein a potential distribution between the first and second aperture array substrates is controlled so as to be symmetric with respect to a height position of the first limiting aperture substrate.

6. The apparatus according to claim 1, further comprising:
a blanking aperture array mechanism arranged on a side of the stage with respect to the first and second aperture array substrates, having a substrate in which a plurality of passing holes allowing the multiple beams to pass through are formed therein, and on which a plurality of blankers are arranged to exercise blanking control of the multiple beams passing through the plurality of passing holes.

7. The apparatus according to claim 2, wherein the first limiting aperture substrate includes a third opening, further comprising:
an alignment coil arranged between the first and second electromagnetic lenses to align the position of the first convergent point of the multiple beams to a position of the third opening of the first limiting aperture substrate.

8. A multiple charged particle beam apparatus comprising:
an emission source configured to emit a charged particle beam;
an illumination lens configured to illuminate the charged particle beam;
a first shaping aperture array substrate that has a plurality of first openings formed therein and receives irradiation of the charged particle beam illuminated in a region including the plurality of first openings as a whole to form multiple beams by making portions of the charged particle beam individually pass through a corresponding one of the plurality of first openings;
a first grating lens that constitutes a concave lens by using the first shaping aperture array substrate as a grating;
a doublet lens arranged on an opposite side of a side of the emission source with respect to the first grating lens and having first and second electromagnetic lenses excited to have magnetic fields with opposite signs and same magnitude;
a first limiting aperture substrate arranged in a position of a first convergent point of the multiple beams between the first and second electromagnetic lenses to limit passing of charged particles deviating from the convergent point;
a stage capable of continuously moving on which a target object receiving the irradiation of a beam group being at least a portion of the multiple beams having passed through the doublet lens is placed;
a blanking aperture array mechanism arranged on a side of the stage with respect to the doublet lens, having a substrate in which a plurality of passing holes are formed therein to allow the multiple beams to pass through, and on which a plurality of blankers are arranged on an undersurface side of the substrate to exercise blanking control of the multiple beams passing through the plurality of passing holes; and
a multiple lens structure located between the first aperture array substrate and the blanking aperture array mechanism;
wherein said first grating lens is arranged so that potential distribution between the first shaping aperture array substrate and the substrate of the blanking aperture array mechanism is symmetric with respect to a height position of the first limiting aperture substrate, generates spherical aberration having negative aberration coefficients, and forms an image on the first shaping aperture array substrate onto the substrate of the blanking aperture array mechanism via the first limiting aperture substrate in equal magnification.

9. The apparatus according to claim 8, further comprising:
a second grating lens arranged on a side of the doublet lens with respect to the substrate and using the substrate as a grating to constitute a concave lens;
an electromagnetic lens that converges the multiple beams having passed through the blanking aperture array mechanism; and
a second limiting aperture member arranged in a position of a second convergent point of the multiple beams converged by the electromagnetic lens to limit passing of charged particles deviating from the second convergent point of the multiple beams.

* * * * *